(12) United States Patent
Hirano

(10) Patent No.: US 11,366,400 B2
(45) Date of Patent: Jun. 21, 2022

(54) METHOD OF DETERMINING DROP RECIPE, IMPRINT APPARATUS, AND ARTICLE MANUFACTURING METHOD

(71) Applicant: CANON KABUSHIKI KAISHA, Tokyo (JP)

(72) Inventor: Shinichi Hirano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 950 days.

(21) Appl. No.: 15/977,165

(22) Filed: May 11, 2018

(65) Prior Publication Data

US 2018/0329315 A1 Nov. 15, 2018

(30) Foreign Application Priority Data

May 15, 2017 (JP) .............................. JP2017-096541
May 7, 2018 (JP) .............................. JP2018-089248

(51) Int. Cl.
  *G03F 9/00* (2006.01)
  *G03F 7/00* (2006.01)

(52) U.S. Cl.
  CPC .......... *G03F 9/7042* (2013.01); *G03F 7/0002* (2013.01)

(58) Field of Classification Search
  CPC ... G03F 9/7042; G03F 7/0002; B29C 31/045; B29C 33/424; B29C 2043/025; B29C 2043/463; B29C 43/372
  See application file for complete search history.

(56) References Cited

U.S. PATENT DOCUMENTS

| 8,512,797 | B2 | 8/2013 | Schumaker |
| 9,389,513 | B2 | 7/2016 | Koshiba |
| 2011/0143271 | A1* | 6/2011 | Koshiba ................. B82Y 40/00 430/30 |

(Continued)

FOREIGN PATENT DOCUMENTS

| JP | 2011124389 A | 6/2011 |
| JP | 2011159764 A | 8/2011 |

(Continued)

OTHER PUBLICATIONS

Office Action issued in Korean Appln. No. 10-2018-0054016 dated Oct. 27, 2020.

(Continued)

*Primary Examiner* — Stella K Yi
(74) *Attorney, Agent, or Firm* — Rossi, Kimms & McDowell LLP

(57) ABSTRACT

A method of determining information indicating an arrangement of an imprint material in an imprint apparatus, includes repeating, by the imprint apparatus, a process of arranging an imprint material on a substrate in accordance with a provisional arrangement, forming a pattern by curing the imprint material in a state in which a mold is brought into contact with the imprint material, and changing the provisional arrangement based on the pattern, until quality of the pattern satisfies a predetermined condition, and determining, by the imprint apparatus, information indicating the arrangement of the imprint material based on the latest provisional arrangement at a stage where the quality of the pattern satisfies the predetermined condition.

11 Claims, 21 Drawing Sheets

(56) References Cited

U.S. PATENT DOCUMENTS

2012/0050441 A1\* 3/2012 Mikami ................ B82Y 40/00
347/110
2012/0072003 A1 3/2012 Matsuoka et al.

FOREIGN PATENT DOCUMENTS

| | | |
|---|---|---|
| JP | 2012506600 A | 3/2012 |
| JP | 2012069701 A | 4/2012 |
| JP | 2016027623 A | 2/2016 |
| JP | 2017055115 A | 3/2017 |
| WO | 2010047766 A1 | 4/2010 |

OTHER PUBLICATIONS

Office Action issued in Japanese Appln. No. 2018-089248 dated Mar. 4, 2022.

\* cited by examiner

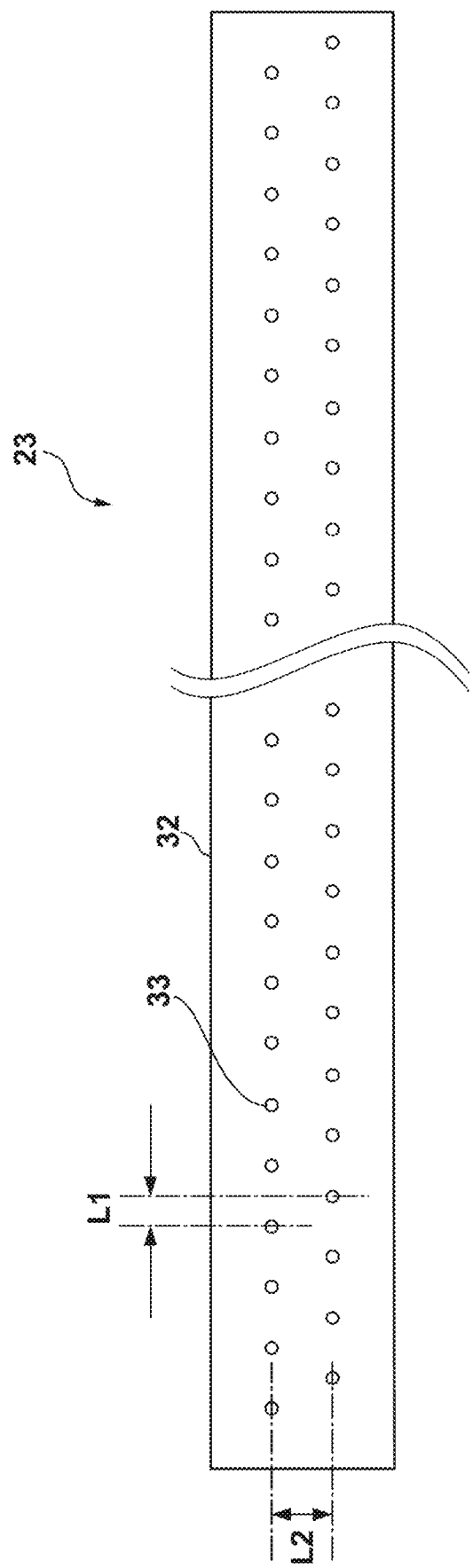

| Auto Drop Recipe Compensation | | |
|---|---|---|
| Max Iteration Count of One Wafer | | |
| Detect Tolerance Local Area | | |
| Defect Tolerance Total Area | | |
| Detect Area <1> UL/DR | | |
| Detect Area <2> UL/DR | | |
| Detect Area <3> UL/DR | | |
| Detect Area <4> UL/DR | | |
| Detect Area <5> UL/DR | | |
| Add Detect Area | ☐ | |
| Shot Peripher al Check | ☐ | |
| Continual Wafer Number | | |
| FF Recipe Name | | |
| PF Recipe Name | | |

F I G. 17A
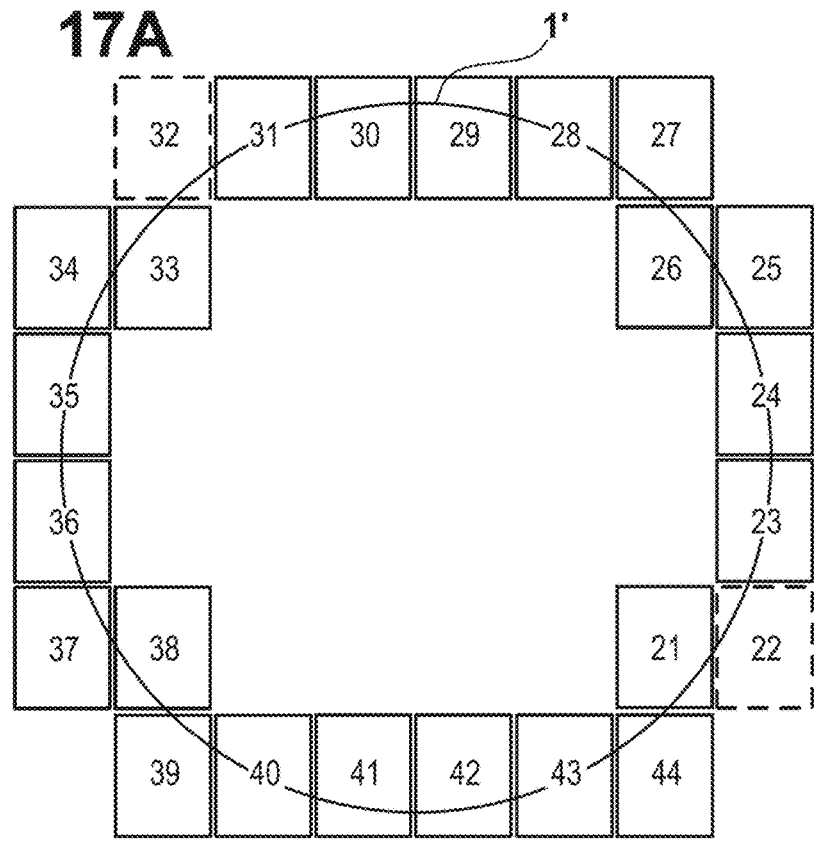
F I G. 17B
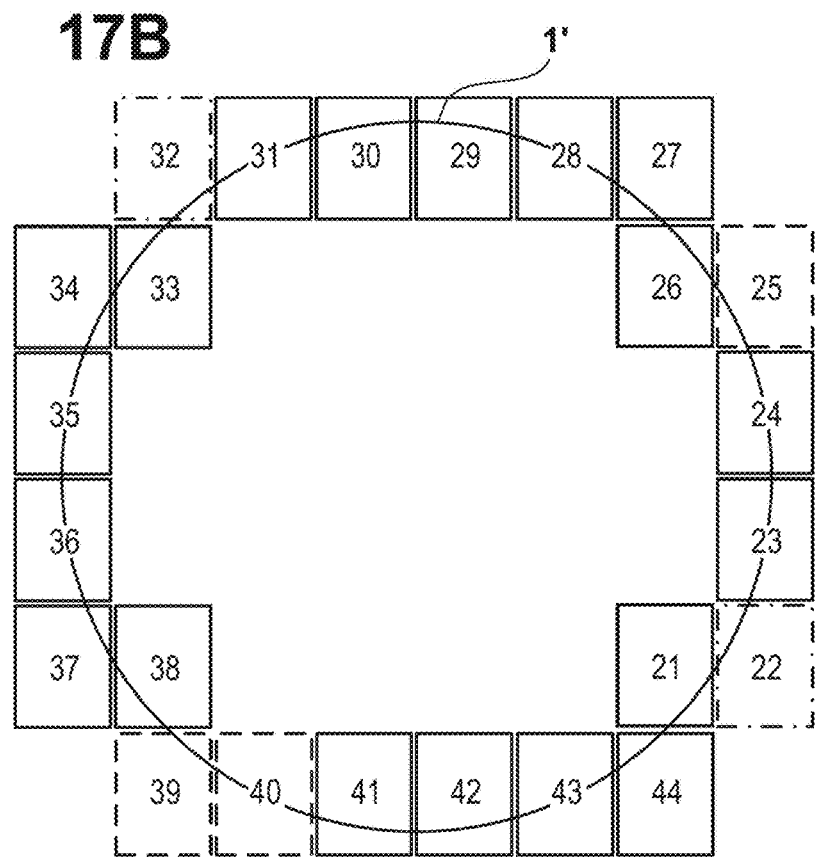

F I G. 17C
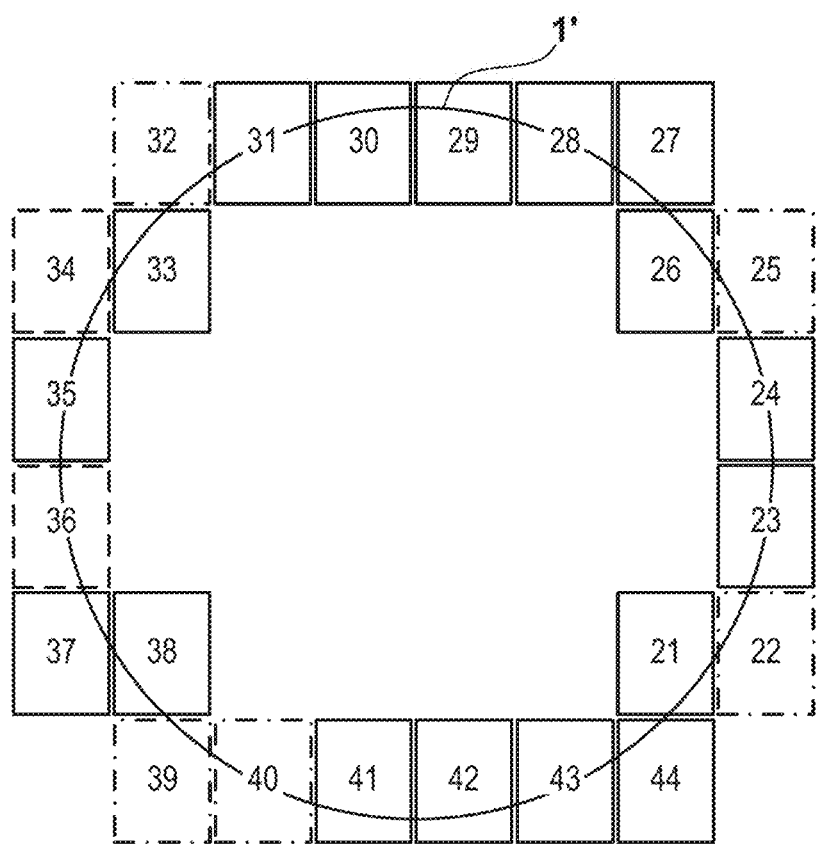

FIG. 19

| Priority | Item | | Tolerance |
|---|---|---|---|
| ☐ | Extrusion Tolerance | | ☐ |
| ☐ | Void Defect Tolerance | Rank A | ☐ |
| ☐ | | Rank B | ☐ |
| ☐ | | Rank C | ☐ |
| ☐ | Alignment Tolerance | X | ☐ |
| ☐ | | Y | ☐ |
| ☐ | RLT Uniformity | | ☐ |
| | | | ☐ |

Optimal Drop Recipe Chooser

FIG. 20

| | | Priority | | | | 5 | 1 | 2 | 4 | 3 | 6 | 7 |
|---|---|---|---|---|---|---|---|---|---|---|---|---|
| | | Tolerance | | | | 1.5 | 0 | 0 | 10 | 5.5 | 8 | 3 |
| | | Conditions | | | | | Evaluation | | | | | |
| Shot | Drop Recipe | Spread Time [S] | Cavity Pressure [KPa] | Imprint Force [N] | Exposure Dose | Extrusion [mm2] | Void Defects | | | Alignment | | RLTU [nm] |
| | | | | | | | Rank A | Rank B | Rank C | X [nm] | Y [nm] | |
| 1 | drp001 | 1.0 | −0.2 | 1.5 | 15.0 | 1.3 | 2 | 5 | 60 | 5.3 | 6.7 | 2.7 |
| 2 | drp001 | 1.0 | −0.2 | 1.5 | 15.0 | 1.2 | 1 | 2 | 14 | 5.2 | 6.4 | 2.6 |
| 3 | drp001 | 1.0 | −0.2 | 1.5 | 14.0 | 1.1 | 0 | 1 | 12 | 5.0 | 6.5 | 2.6 |
| 4 | drp001 | 1.0 | −0.2 | 1.5 | 14.0 | 1.0 | 0 | 0 | 7 | 5.1 | 6.7 | 2.5 |
| 5 | drp001 | 1.0 | −0.1 | 1.5 | 15.0 | 1.0 | 0 | 0 | 6 | 4.8 | 7.0 | 2.3 |
| 6 | drp001 | 1.0 | −0.1 | 1.5 | 15.0 | 1.0 | 0 | 0 | 4 | 4.8 | 6.9 | 2.4 |
| 7 | drp001 | 1.0 | −0.1 | 1.5 | 14.0 | 0.8 | 0 | 0 | 3 | 5.4 | 6.6 | 2.0 |
| 8 | drp001 | 1.0 | −0.1 | 1.5 | 14.0 | 0.8 | 0 | 0 | 2 | 5.3 | 6.5 | 2.5 |
| 9 | drp009 | 1.2 | −0.2 | 1.5 | 15.0 | 1.5 | 1 | 4 | 54 | 5.3 | 6.4 | 2.2 |
| 10 | drp009 | 1.5 | −0.2 | 1.5 | 15.0 | 1.4 | 1 | 3 | 19 | 5.1 | 5.9 | 2.3 |
| 11 | drp009 | 1.2 | −0.2 | 1.5 | 14.0 | 1.4 | 0 | 1 | 11 | 5.1 | 6.0 | 2.5 |
| 12 | drp009 | 1.2 | −0.2 | 1.5 | 14.0 | 1.4 | 0 | 0 | 7 | 5.1 | 5.9 | 2.3 |
| 13 | drp009 | 1.2 | −0.1 | 1.5 | 15.0 | 1.0 | 0 | 0 | 7 | 5.1 | 5.3 | 2.1 |
| 14 | drp009 | 1.2 | −0.1 | 1.5 | 15.0 | 1.0 | 0 | 0 | 6 | 4.9 | 5.4 | 2.2 |
| 15 | drp00a | 1.5 | −0.1 | 1.5 | 14.0 | 1.8 | 0 | 2 | 33 | 5.1 | 5.7 | 1.9 |
| 16 | drp00a | 1.5 | −0.1 | 1.5 | 14.0 | 1.8 | 0 | 1 | 9 | 4.7 | 5.4 | 2.0 |
| 17 | drp00a | 1.5 | −0.1 | 1.5 | 15.0 | 1.7 | 0 | 0 | 6 | 5.2 | 5.3 | 2.3 |
| 18 | drp00a | 1.5 | −0.1 | 1.5 | 15.0 | 1.8 | 0 | 0 | 2 | 5.1 | 5.8 | 2.4 |
| 19 | drp00a | 1.5 | −0.1 | 1.5 | 14.0 | 1.5 | 0 | 0 | 2 | 5.1 | 5.5 | 2.0 |
| 20 | drp00a | 1.5 | −0.1 | 1.5 | 14.0 | 1.5 | 0 | 0 | 2 | 5.0 | 5.5 | 1.9 |

METHOD OF DETERMINING DROP RECIPE, IMPRINT APPARATUS, AND ARTICLE MANUFACTURING METHOD

BACKGROUND OF THE INVENTION

Field of the Invention

The present invention relates to a method of determining a drop recipe, an imprint apparatus, and an article manufacturing method.

Description of the Related Art

An imprint apparatus forms a pattern made of a cured product of an imprint material on a substrate by supplying the imprint material onto the substrate, bringing a mold into contact with the imprint material, and curing the imprint material. The imprint material can be supplied onto the substrate by discharging the imprint material from a dispenser in accordance with a drop recipe. The drop recipe is information indicating the arrangement of the imprint material on the substrate. Japanese Patent Laid-Open No. 2012-69701 has described an imprint method of examining a defect in pattern transferred to a substrate, extracting the outline of the defect, and generating a drop recipe based on pattern data of a semiconductor integrated circuit on which this outline is reflected. Japanese Patent Laid-Open No. 2011-159764 has described a pattern forming method of setting a resist coating distribution based on information on a template pattern formed on a template.

In order to create a drop recipe that matches a new pattern, an initial drop recipe is created in accordance with the specifications of the pattern, the specifications of the imprint apparatus, the specifications of the imprint material, or the like. Subsequently, the drop recipe is optimized while iterating an imprint process and an evaluation of a resulting pattern formed on the substrate, making it possible to determine a final drop recipe. An enormous time and cost are needed for this job.

SUMMARY OF THE INVENTION

The present invention provides a technique advantageous in determining a drop recipe efficiently.

One of aspects of the present invention provides a method of determining information indicating an arrangement of an imprint material in an imprint apparatus, the method comprising: repeating, by the imprint apparatus, a process of arranging an imprint material on a substrate in accordance with a provisional arrangement, forming a pattern by curing the imprint material in a state in which a mold is brought into contact with the imprint material, and changing the provisional arrangement based on the pattern, until quality of the pattern satisfies a predetermined condition; and determining, by the imprint apparatus, information indicating the arrangement of the imprint material based on the latest provisional arrangement at a stage where the quality of the pattern satisfies the predetermined condition.

Further features of the present invention will become apparent from the following description of exemplary embodiments with reference to the attached drawings.

BRIEF DESCRIPTION OF THE DRAWINGS

FIG. 3 is a view showing an example of the arrangement of a discharge head of an imprint material supply;

FIG. 17A is a view for explaining a method of generating a drop recipe for a partial shot region;

FIG. 17B is a view for explaining the method of generating the drop recipe for the partial shot region;

FIG. 17C is a view for explaining the method of generating the drop recipe for the partial shot region;

FIG. 19 is a view exemplifying a setting screen provided by a user interface; and FIG. 20 is a view showing an example of a data table indicating evaluation conditions and evaluation indices.

DESCRIPTION OF THE EMBODIMENTS

The present invention will be described below with reference to the accompanying drawings by way of an exemplary embodiment.

Figure 1:
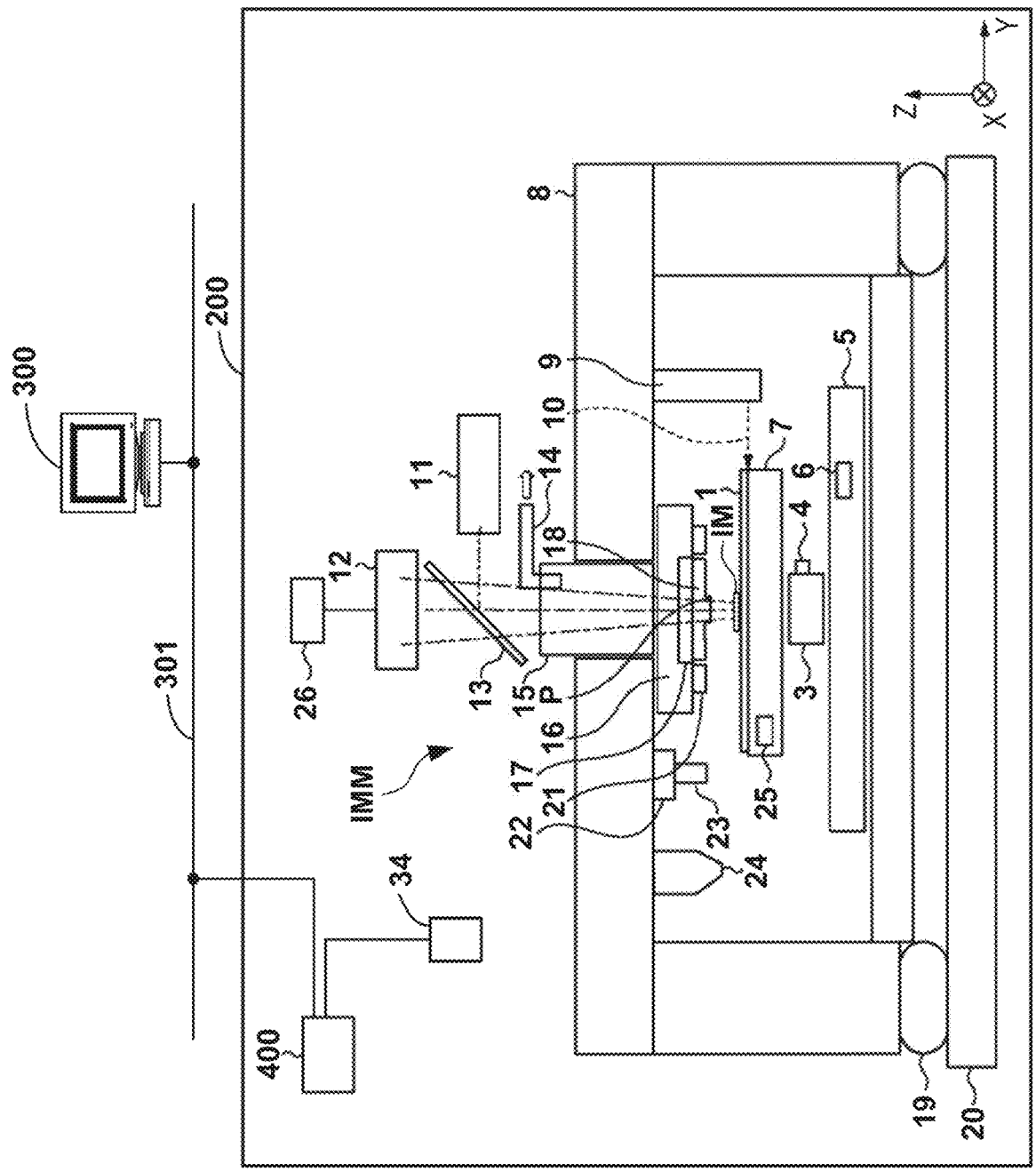
FIG. 1 is a view showing the arrangement of an imprint apparatus according to an embodiment of the present invention.

FIG. 1 shows the arrangement of an imprint apparatus 200 according to the first embodiment of the present invention. The imprint apparatus 200 forms a pattern made of a cured product of an imprint material IM by arranging the imprint material IM on a substrate 1 and applying curing energy to the imprint material IM in a state in which a mold 18 is brought into contact with the imprint material IM. Consequently, the pattern of the mold 18 is transferred to the substrate 1. A process of thus forming the pattern made of the cured product of the imprint material IM on the substrate 1 will be referred to as an imprint process.

A curable composition (may also be referred to as an uncured resin) which is cured by receiving curing energy is used for the imprint material. An electromagnetic wave, heat, or the like can be used as the curing energy. For example, light such as infrared light, visible rays, ultraviolet light, or the like whose wavelength is selected from a range of 10 nm (inclusive) to 1 mm (inclusive) can be used as the electromagnetic wave. The curable composition can be a composition that is cured by light irradiation or application of heat. Out of these, a photo-curable composition that is cured by light irradiation contains at least a polymerizable compound and a photopolymerization initiator, and may further contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like. The imprint material can be arranged, by an imprint material supply (dispenser), on a substrate in a droplet-like shape, or an island-like shape or a film-like shape formed by a plurality of droplets connected to each other. The viscosity (viscosity at 25° C.) of the imprint material can be set at, for example, 1 mPa·s (inclusive) to 100 mPa·s (inclusive). For example, glass, ceramics, a metal, a semiconductor, a resin, or the like can be used as a material of the substrate. A member made of a material different from that for the substrate may be provided on the surface of the substrate, as needed. For example, a silicon wafer, a compound semiconductor wafer, silica glass, or the like is used as the substrate.

An example in which ultraviolet light is used as energy for curing the imprint material IM will be described below. In this specification and the accompanying drawings, directions are shown in an X-Y-Z coordinate system in which a direction parallel to the surface of the substrate 1 forms an X-Y plane. Let an X direction, a Y direction, and a Z direction be the directions parallel to an X-axis, a Y-axis, and a Z-axis, respectively, in the X-Y-Z coordinate system. Let $\theta X$, $\theta Y$, and $\theta Z$, respectively, be rotation about the X-axis, rotation about the Y-axis, and rotation about the Z-axis. Control or driving with regard to the X-axis, the Y-axis, and the Z-axis means control or driving with regard to the direction parallel to the X-axis, the direction parallel to the Y-axis, and the direction parallel to the Z-axis, respectively. Further, control or driving with regard to a $\theta X$-axis, a $\theta Y$-axis, and a $\theta Z$-axis means control or driving with regard to rotation about an axis parallel to the X-axis, rotation about an axis parallel to the Y-axis, and rotation about an axis parallel to the Z-axis, respectively. A position is information that can be specified based on X-axis, Y-axis, and Z-axis coordinates. An attitude is information that can be specified by values on the $\theta X$-axis, the $\theta Y$-axis, and the $\theta Z$-axis. Alignment means controlling the position and/or attitude. Alignment can include the control of the position and/or attitude of at least one of the substrate and the mold.

The imprint apparatus 200 includes a measurement device 4, a measurement device 6, a substrate stage 7, a bridge structure 8, a measurement device 9, a curing light source 11, an alignment measurement device 12, a half mirror 13, an exhaust duct 14, a connecting member 15, and a mold head 16. The imprint processing unit 200 further includes gas springs 19, a base surface plate 20, a gas supply 21, a holder 22, an imprint material supply (dispenser) 23, an off-axis scope 24, a pressure sensor 25, a detector 26, a controller 400, and a user interface 34. The controller 400 is connected to an integrated computer 300 via a network 301. The mold head 16 includes a mold chuck 17 that holds the mold 18 having a pattern surface P. A three-dimensional pattern corresponding to a pattern to be formed on the substrate 1 is formed on the pattern surface P of the mold 18.

The detector 26 can observe, as image information, the contact state of the mold 18 with respect to the imprint material on the substrate, the filling state of the mold 18 with the imprint material on the substrate, and the separation state of the mold 18 from the imprint material on the substrate. The detector 26 can also observe the positional relationship between the periphery of the substrate and a substrate chuck by moving the substrate stage 7. The mold chuck 17 holds the mold 18 by, for example, vacuum suction. The mold chuck 17 may have a structure of preventing the mold 18 from dropping off from the mold chuck 17. In this embodiment, the mold chuck 17 is firmly coupled to the mold head 16. The mold head 16 can have a mechanism capable of moving (driving) itself in at least three axis directions of Z, $\theta X$, and $\theta Y$ with reference to the bridge structure 8. The mold head 16 is connected to the bridge structure 8 and supported by the bridge structure 8 via the connecting member 15. The alignment measurement device 12 is also supported by the bridge structure 8.

The alignment measurement device 12 performs alignment measurement for alignment between the mold 18 and the substrate 1. In this embodiment, the alignment measurement device 12 includes an alignment detection system for generating an alignment signal by detecting a mark provided on the mold 18, and a mark provided on the substrate stage 7 and the substrate 1. Furthermore, the alignment measurement device 12 can include a camera (image capturing device) and similarly to the detector 26, have a function of observing the cured state (imprint state) of the imprint material IM on the substrate 1 by irradiation with ultraviolet light. The alignment measurement device 12 can also have a function of observing the contact state of the mold 18 with respect to the imprint material on the substrate 1, the filling state of the mold 18 with the imprint material on the substrate, and the separation state of the mold 18 from the imprint material on the substrate. The half mirror 13 is arranged above the connecting member 15. Light from the curing light source 11 is reflected by the half mirror 13 and transmitted through the mold 18, thereby irradiating the imprint material IM on the substrate 1. The imprint material IM on the substrate 1 is cured by irradiation with light from the curing light source 11.

The bridge structure 8 is supported by the base surface plate 20 via the gas springs 19 for insulating a vibration from the floor. Each gas spring 19 can have a structure generally adopted as an active anti-vibration function by an exposure apparatus. For example, each gas spring 19 includes an XYZ relative position measurement sensor, an XYZ driving linear motor, a servo valve for controlling the amount of air in the gas spring, and the like, which are provided in the bridge structure 8 and the base surface plate 20. The imprint material supply 23 (dispenser) including a nozzle for supplying (applying) the imprint material IM to the substrate 1, and a controller that controls the timing and amount of the supply are attached to the bridge structure 8 via the holder 22. The imprint material supply 23, for example, supplies droplets of the imprint material IM to the substrate 1. It is possible to arrange the imprint material IM in shot regions each having an arbitrary shape such as a rectangular shape on the substrate 1 by moving the substrate stage 7 (that is, the substrate 1) while supplying the imprint material IM from the imprint material supply 23 to the substrate 1.

The substrate 1 can have, for example, a circular shape. The shot regions can include full shot regions each having a rectangular shape and partial shot regions each part of which is defined by the edge of the substrate 1 (a substrate edge or the periphery of the substrate). Each full shot region can have the dimension of, for example, 33 mm×26 mm. One shot region can include a plurality of chip regions.

In an imprint process executed by the imprint apparatus 200, a layer can remain in the concave portion of the three-dimensional pattern formed by a cured product of the imprint material IM on the surface of the substrate 1. This layer will be referred to as a residual layer. The residual layer can be removed by etching. The thickness of the residual layer will be referred to as an RLT (Residual Layer Thickness) hereinafter. If no layer of a thickness corresponding to a required RLT is formed in a shot region, the substrate 1 is unwantedly hollowed out by etching. In this embodiment, the imprint material IM is arranged in an appropriate region on the substrate 1 by a combination of discharge of the imprint material IM by the imprint material supply 23 and movement of the substrate stage 7.

The substrate stage 7 has a substrate chuck (substrate holder) and holds the substrate 1 by the substrate chuck. The substrate stage 7 has a mechanism capable of moving itself in six axis directions of X, Y, Z, θX, θY, and θZ. In this embodiment, the substrate stage 7 is supported by the bridge structure 8 via an X slider 3 including an X-direction moving mechanism and a Y slider 5 including a Y-direction moving mechanism. The X slider 3 includes the measurement device 4 for measuring the relative positions of the X slider 3 and Y slider 5. The Y slider 5 includes the measurement device 6 for measuring the relative positions of the Y slider 5 and bridge structure 8. Therefore, the measurement devices 4 and 6 measure the position of the substrate stage 7 with reference to the bridge structure 8. In this embodiment, each of the measurement devices 4 and 6 is formed by an encoder (linear encoder).

The distance in the Z direction between the substrate stage 7 and the bridge structure 8 is determined by the bridge structure 8, the X slider 3, and the Y slider 5. It is possible to suppress a variation of the imprint operation in the Z direction of the substrate stage 7 and the bridge structure 8 to a variation of several tens of nm by maintaining rigidities in the Z and tilt directions of the X slider 3 and Y slider 5 at a value as high as about ten nm/N.

The measurement device 9 is provided in the bridge structure 8, and is formed by an interferometer in this embodiment. The measurement device 9 measures the position of the substrate stage 7 by emitting measurement light 10 toward the substrate stage 7 and detecting the measurement light 10 reflected by an interferometer mirror provided on an end face of the substrate stage 7. The measurement device 9 measures the position of the substrate stage 7 at a position closer than the measurement devices 4 and 6 with respect to the holding surface of the substrate 1 of the substrate stage 7. Note that FIG. 1 shows only one beam of the measurement light 10 emitted from the measurement device 9 to the substrate stage 7, but the measurement device 9 can be configured to measure at least the XY position, rotation amount, and tilt amount of the substrate stage 7.

To improve the filling property of the imprint material IM in the pattern of the mold 18, the gas supply 21 supplies a filling gas in the vicinity of the mold 18, more specifically, a space between the mold 18 and the substrate 1. The filling gas includes at least one of a permeable gas and a condensable gas in order to quickly decrease the filling gas (bubbles) confined between the mold 18 and the imprint material, and accelerate filling of the pattern (concave portion) of the mold 18 with the imprint material. The permeable gas is a gas which has high permeability with respect to the mold 18, and is permeated through the mold 18 when the mold 18 is brought into contact with the imprint material on the substrate 1. The condensable gas is a gas which is liquefied (condensed) when the mold 18 is brought into contact with the imprint material on the substrate 1.

The off-axis scope 24 detects a reference mark or alignment mark provided on a reference plate arranged on the substrate stage 7 without intervention of the mold 18. Furthermore, the off-axis scope 24 can detect an alignment mark provided on the substrate 1 (each shot region thereof). In this embodiment, the pressure sensor 25 is provided in the substrate stage 7, and detects the pressure which acts on the substrate stage 7 by bringing the mold 18 into contact with the imprint material on the substrate 1. The pressure sensor 25 functions as a sensor for detecting the contact state between the mold 18 and the imprint material on the substrate 1 by detecting the pressure acting on the substrate stage 7. The pressure sensor 25 may be provided in the mold head 16, and need only be provided in at least one of the mold head 16 and the substrate stage 7.

The refractive index of the filling gas supplied from the gas supply 21 is largely different from that of air. Therefore, if the measurement devices 4 and 6 are exposed to the filling gas (that is, if the filling gas leaks to measurement optical paths of the measurement devices 4 and 6), the measurement values (measurement results) of the measurement devices 4 and 6 vary. Such a problem, in particular, is conspicuous to an interferometer having a long measurement optical path length and has a high gain when the position of the substrate stage 7 is controlled, causing a servo error. Even if an encoder having a short measurement optical path length is used, it is impossible to ignore the influence in an imprint apparatus that requires a measurement accuracy on the order of nanometer. However, the measurement optical path length of the encoder is shorter than that of the interferometer, and thus the influence is smaller than in the interferometer. As shown in FIG. 1, in this embodiment, an enough distance can be left from the gas supply 21 (the supply port of the filling gas thereof) to the measurement devices 4 and 6, and the measurement devices 4 and 6 are formed by encoders. Therefore, the measurement devices 4 and 6 are configured to receive less influence of a variation in measurement value by the filling gas, hardly causing the servo error.

As described above, the gas supply 21 supplies the filling gas to the space between the mold 18 and the substrate 1 while performing imprint processing. The filling gas supplied between the mold 18 and the substrate 1 is sucked from the upper portion of the mold head 16 via the exhaust duct 14, and exhausted outside the imprint apparatus 200. Furthermore, the filling gas supplied between the mold 18 and the substrate 1 may be recovered by a gas recovery mechanism (not shown) instead of being exhausted outside.

Figure 2A:
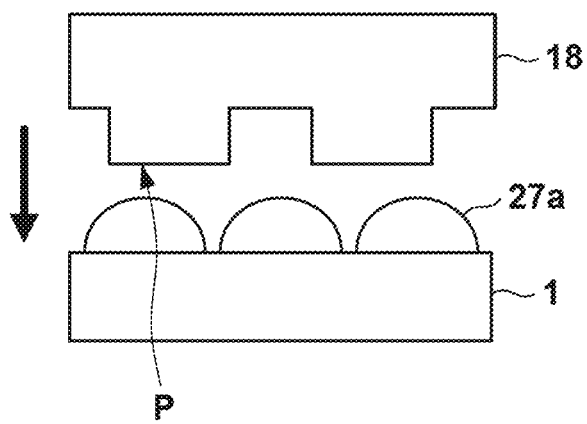
FIGS. 2A to 2D are views schematically showing an imprint process.
Figure 2B:
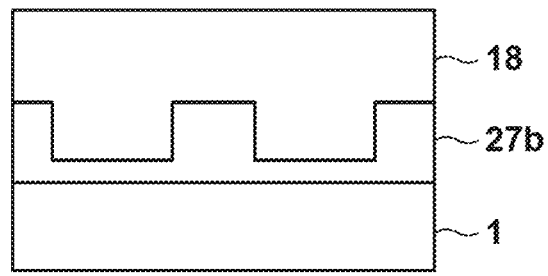
Figure 2C:
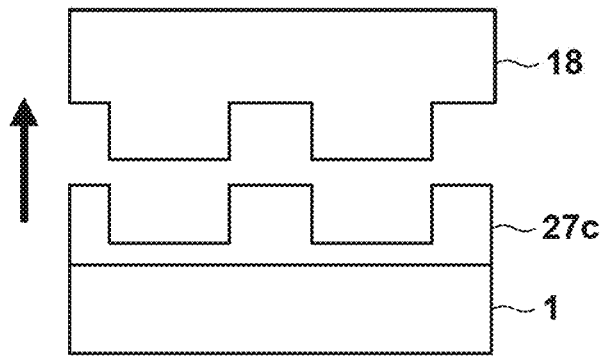
Figure 2D:
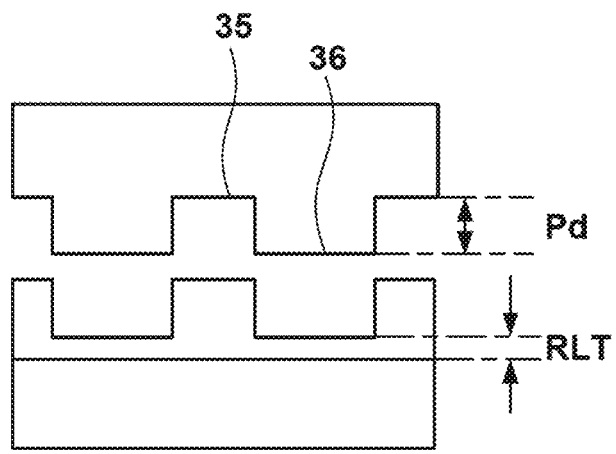

FIGS. 2A to 2D schematically show the imprint process. FIG. 2A shows a state before the pattern surface P of the mold 18 starts to contact the shot region of the substrate 1 to which an imprint material 27a is supplied by the imprint material supply 23. FIG. 2B shows a state in which the pattern surface P of the mold 18 and the imprint material on the shot region of the substrate 1 are in contact with each other. In this state, the imprint material on the shot region of the substrate 1 is irradiated with light from the curing light source 11. Consequently, an imprint material 27b is cured. FIG. 2C shows a state in which the mold 18 is released from the cured imprint material on the shot region of the substrate 1 by raising the mold head 16. Consequently, a pattern 27c corresponding to the pattern on the pattern surface P of the mold 18 remains in the shot region of the substrate 1. FIG. 2D shows the pattern on the pattern surface P of the mold 18 and the cured imprint material. The pattern of the mold 18 includes a convex forming pattern 35 corresponding to a convex pattern to be formed on the substrate and a concave forming pattern 36 for a concave pattern to be formed on the substrate. Pd represents a Pattern Depth, and RLT represents a Residual Layer Thickness.

FIG. 3 shows an example of the arrangement of a discharge head 32 of the imprint material supply 23. The discharge head 32 includes a plurality of orifices 33. If the arrangement intervals of the plurality of orifices 33 are narrowed, a time required to fill the inside of the convex forming pattern of the mold 18 with the imprint material is shortened. On the other hand, if the arrangement intervals are too narrow, it may become difficult to manufacture the discharge head 32, and the droplets of the imprint material discharged from the adjacent orifices 33 may interfere with each other. If a plurality of droplets of the imprint material interfere with each other, they are bonded to each other. This may cause misalignment of droplets arranged on the substrate. In the example of FIG. 3, the plurality of orifices 33 are arrayed so as to form two columns, and a distance L1 between the centers of the orifices 33 in a column direction and an interval L2 between the center lines of the two columns are used as arrangement information of the orifices 33.

Figure 4:
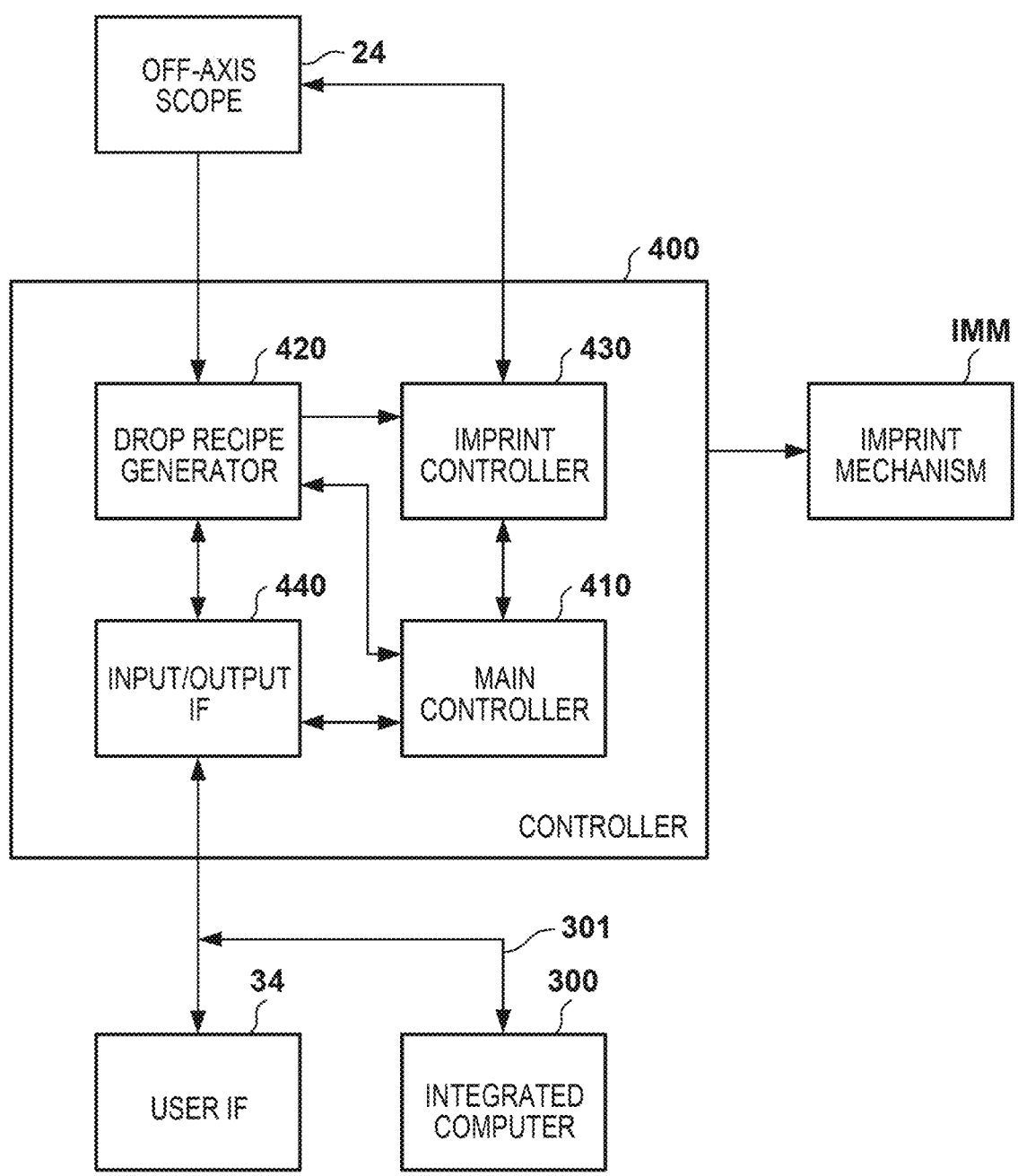
FIG. 4 is a block diagram showing an example of the arrangement of a controller of the imprint apparatus.

FIG. 4 shows an example of the arrangement of the controller 400. The controller 400 can be formed by, for example, a general-purpose computer with a program installed, a PLD (short for Programmable Logic Device) such as an FPGA (short for Field Programmable Gate Array), an ASIC (short for Application Specific Integrated Circuit), or a combination of all or some of them.

The controller 400 can include a main controller 410, a drop recipe generator 420, an imprint controller 430, and an input/output interface 440. The main controller 410 can control the drop recipe generator 420, the imprint controller 430, and the input/output interface 440. The drop recipe generator 420 generates a drop recipe indicating the arrangement of the imprint material IM (droplets) supplied onto the substrate 1 by the imprint material supply 23. The imprint controller 430 controls an imprint mechanism IMM so as to perform the imprint process. The imprint mechanism IMM is a mechanism for performing the imprint process. The imprint mechanism IMM can include the constituent elements described with reference to FIG. 1, for example, constituent elements for conveyance of the substrate 1, supply of the imprint material IM to the substrate 1, driving of the substrate stage 7, alignment, irradiation of the imprint material IM with light, driving of the mold 18, and the like.

The input/output interface 440 is connected to the user interface 34 and connected to the integrated computer 300 via the network 301. The user interface 34, for example, receives information concerning generation of the drop recipe from a user or provides the information for the user. The integrated computer 300 provides control information (process recipe) for controlling the imprint process for the controller 400. The off-axis scope 24 provides image data obtained by capturing a pattern formed on the substrate 1 for the drop recipe generator 420. The image data obtained by capturing the pattern formed on the substrate 1 may be provided from the detector 26 or the alignment measurement device 12 to the drop recipe generator 420. Alternatively, another image capturing unit that provides the image data obtained by capturing the pattern formed on the substrate 1 for the drop recipe generator 420 may be provided.

Figure 5A:
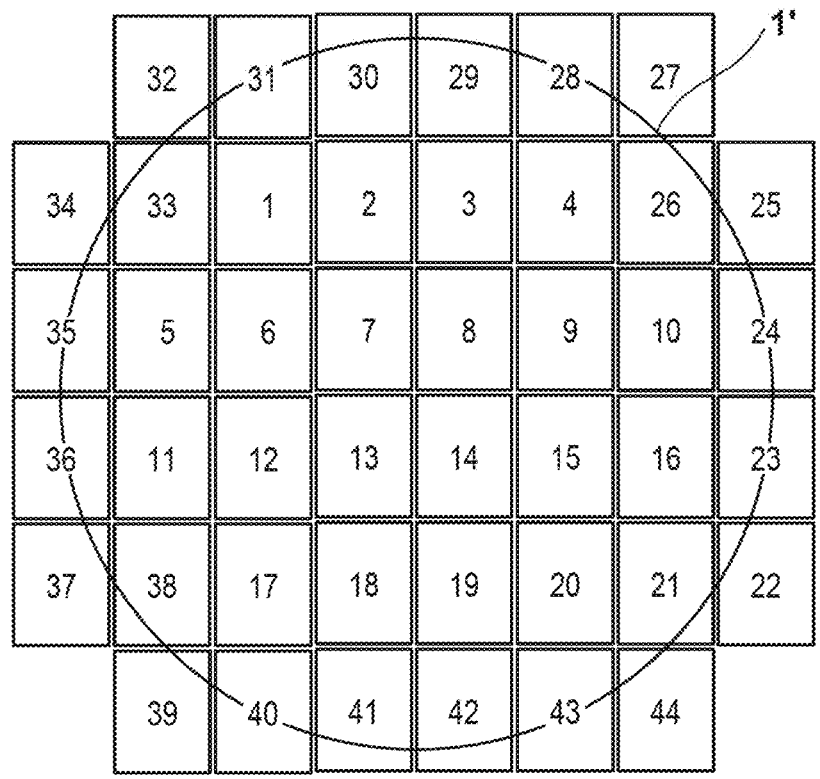
FIG. 5A is a view exemplifying a shot layout.

FIG. 5A exemplifies a shot layout. The shot layout is the arrangement of a plurality of shot regions on the substrate 1. As described above, the plurality of shot regions on the substrate 1 can include full shot regions each having a rectangular shape and partial shot regions each part of which is defined by a substrate edge 1' (the edge or periphery of the substrate 1). The full shot regions are also referred to as full field shot regions (FF shot regions). The partial shot regions are also referred to as partial field shot regions (PF shot regions). In the example of FIG. 5A, shot region numbers=1 to 20 represent the full shot regions, and shot region numbers=22 to 44 represent the partial shot regions. Shot layout information indicating the arrangement of the shot regions can be provided, as a part of a process recipe, from the integrated computer 300 or the user interface 34 to the controller 400 of the imprint apparatus 200. The process recipe can additionally contain control information (for example, an exposure dose (Exposure Dose)) for curing the imprint material IM, information indicating an alignment condition, and information indicating a waiting time (Spread Time) from bringing the mold into contact with the imprint material to curing the imprint material, a pressure (Imprint Force) at the timing when the mold is brought into contact with the imprint material, and a pressure (Cavity Pressure) for deforming a pattern surface of the mold at the timing when the pattern surface P contacts the imprint material.

A plurality of full shot regions on the substrate 1 have the same shape, and thus in general, a common drop recipe to the plurality of full shot regions can be determined. The common drop recipe for the full shot regions can be determined by performing the imprint process experimentally by using the plurality of full shot regions on the substrate and evaluating a pattern formed by this.

More specifically, a method of determining the drop recipe indicating the arrangement information of the droplets of the imprint material supplied to the full shot regions can include, after a provisional drop recipe is prepared, repeating unit processing of (a) arranging the imprint material on the full shot regions in accordance with the provisional drop recipe and curing the imprint material in a state in which the mold is brought into contact with the imprint material, thereby forming a pattern, and (b) changing the provisional drop recipe based on the pattern until the quality of the pattern satisfies a predetermined condition while changing a full shot region to be used.

The method of determining can also include determining a drop recipe based on the latest provisional drop recipe at a stage where the quality of the pattern satisfies the predetermined condition. In the example of FIG. 5A, the repeating can be executed by using all or some of the full shot regions to which shot region numbers=1 to 20 are given. Note that if the quality of the pattern does not satisfy the predetermined condition even by executing the repeating by using all the full shot regions to which shot region numbers=1 to 20 are given, the repeating can be continued by using the other substrate 1.

Unlike the full shot regions, a plurality of partial shot regions on the substrate 1 have different shapes, and thus in general individual drop recipes (arrangement information of the droplets of the imprint material supplied to the partial shot regions) need to be determined for the individual partial shot regions.

The drop recipes for the partial shot regions can be determined by performing the imprint process experimentally by using the individual partial shot regions on the substrate 1 and evaluating a pattern formed by this.

More specifically, a method of determining the drop recipes for the partial shot regions can include, after a provisional drop recipe is prepared, repeating unit processing of (a) arranging the imprint material on the partial shot regions in accordance with the provisional drop recipe and curing the imprint material in the state in which the mold is brought into contact with the imprint material, thereby forming a pattern, and (b) changing the provisional drop recipe based on the pattern until the quality of the pattern satisfies a predetermined condition while changing a substrate to be used.

The method of determining can also include determining drop recipes based on the latest provisional drop recipe at a stage where the quality of the pattern satisfies the predetermined condition. In the example of FIG. 5A, if the unit processing is performed N times (N is a natural number) in order to determine a drop recipe for a designated partial shot region out of the partial shot regions having shot region numbers=21 to 44, N substrates are needed.

Thus, a process of determining the drop recipes for the partial shot regions is lower in efficiency than a process of determining the drop recipe for the full shot regions. It is possible, however, to improve the efficiency if the process of determining the partial shot region is entirely or partially performed after performing the process for determining the drop recipe for the full shot regions. Note that the process for determining the partial shot region can be performed by using, as the first provisional drop recipe, a drop recipe finally determined for the full shot regions (or the latest provisional drop recipe if the drop recipe has not been determined finally yet). The first provisional drop recipe for the partial shot region can be formed by removing a part of the arrangement of the imprint material (droplets that cannot be arranged on the substrate) in the drop recipe for the full shot regions.

Figure 5B:
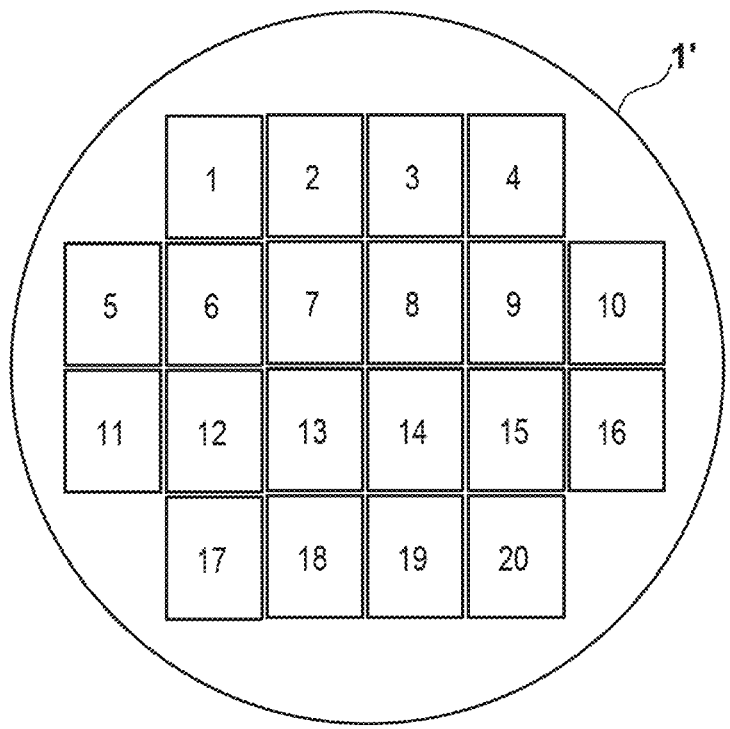
FIG. 5B is a view exemplifying a full shot layout.
Figure 5C:
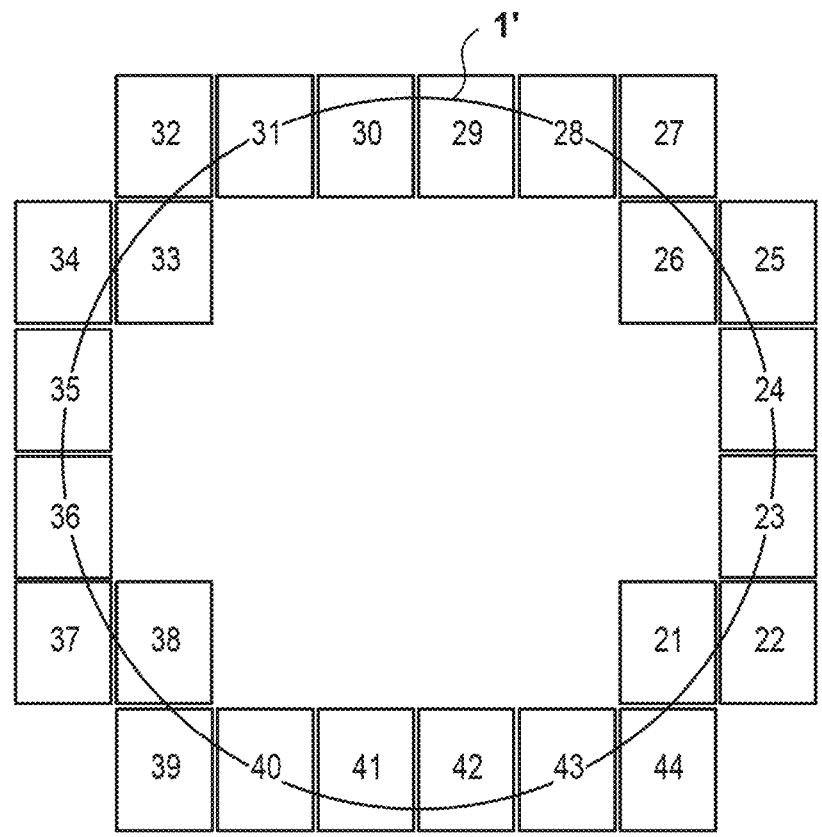
FIG. 5C is a view exemplifying a partial shot layout.

FIG. 5B exemplifies a full shot layout indicating the arrangement of the full shot regions. FIG. 5C exemplifies a partial shot layout indicating the arrangement of the partial shot regions. In this embodiment, a process recipe concerning the full shot layout and a process recipe concerning the partial shot regions are provided from the integrated computer 300 or the user interface 34 to the controller 400 of the imprint apparatus 200.

Figure 6:
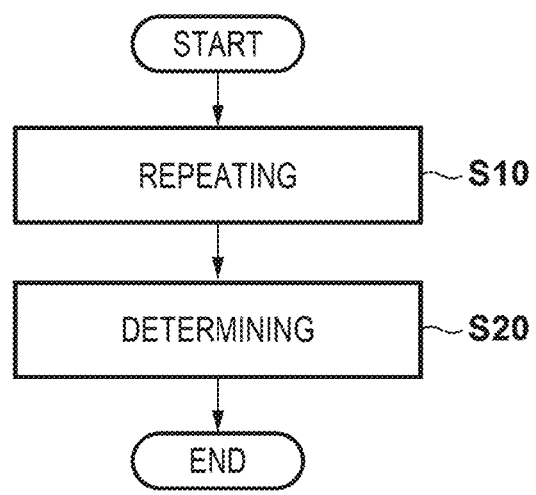
FIG. 6 is a flowchart showing the procedure for a drop recipe generation method performed by the imprint apparatus.

FIG. 6 shows the procedure for a drop recipe generation method performed by the imprint apparatus 200. This operation is controlled by the controller 400. In step S10, the main controller 410 controls the drop recipe generator 420, the imprint controller 430, and the input/output interface 440 to perform repeating. More specifically, in step S10, the main controller 410 obtains, by the input/output interface 440, a conditioning recipe that includes a provisional drop recipe from the integrated computer 300 and/or the user interface 34. Then, the main controller 410 repeats unit processing of (a) arranging the imprint material on a shot region in accordance with the provisional drop recipe and curing the imprint material in the state in which the mold is brought into contact with the imprint material, thereby forming a pattern, and (b) changing the provisional drop recipe based on the pattern until the quality of the pattern satisfies a predetermined condition while changing a full shot region to be used. Note that processing of (a) can be performed when the main controller 410 controls the imprint mechanism IMM via the imprint controller 430. Processing of (b) can be performed when the main controller 410 causes the off-axis scope 24 (measurement device) to capture the pattern formed on the substrate 1 in the processing of (1), and the drop recipe generator 420 to process image data obtained by this.

The drop recipe generator 420 evaluates, based on the image data provided from the off-axis scope 24, the pattern formed on the substrate 1 and changes the provisional drop recipe so as to eliminate a defect. For example, the drop recipe generator 420 adds the droplet (drop) of the imprint material IM to a region short of the imprint material IM and removes the droplet (drop) of the imprint material IM from a region in excess of the imprint material IM. The above-described predetermined condition can fall within allowable ranges of the area, number, and the like of defect regions existing in the pattern formed on the substrate 1.

In step S20, the main controller 410 determines a drop recipe for the drop recipe generator 420 based on the latest provisional drop recipe at the stage where the quality of the pattern formed on the substrate 1 satisfies the above-described predetermined condition.

The conditioning recipe can include at least one of an FF shot conditioning recipe that determines a drop recipe for the full shot regions and a PF shot conditioning recipe that determines drop recipes for the partial shot regions. If the conditioning recipe includes a command to perform both the FF shot conditioning recipe and the PF shot conditioning recipe, a process for determining the drop recipe for the full shot regions can be performed first, and then a process for determining the drop recipes for the partial shot regions can be performed. If the conditioning recipe includes a command to perform only one of the FF shot conditioning recipe and the PF shot conditioning recipe, a process for determining a drop recipe can be performed on only one of them.

Figure 7A:
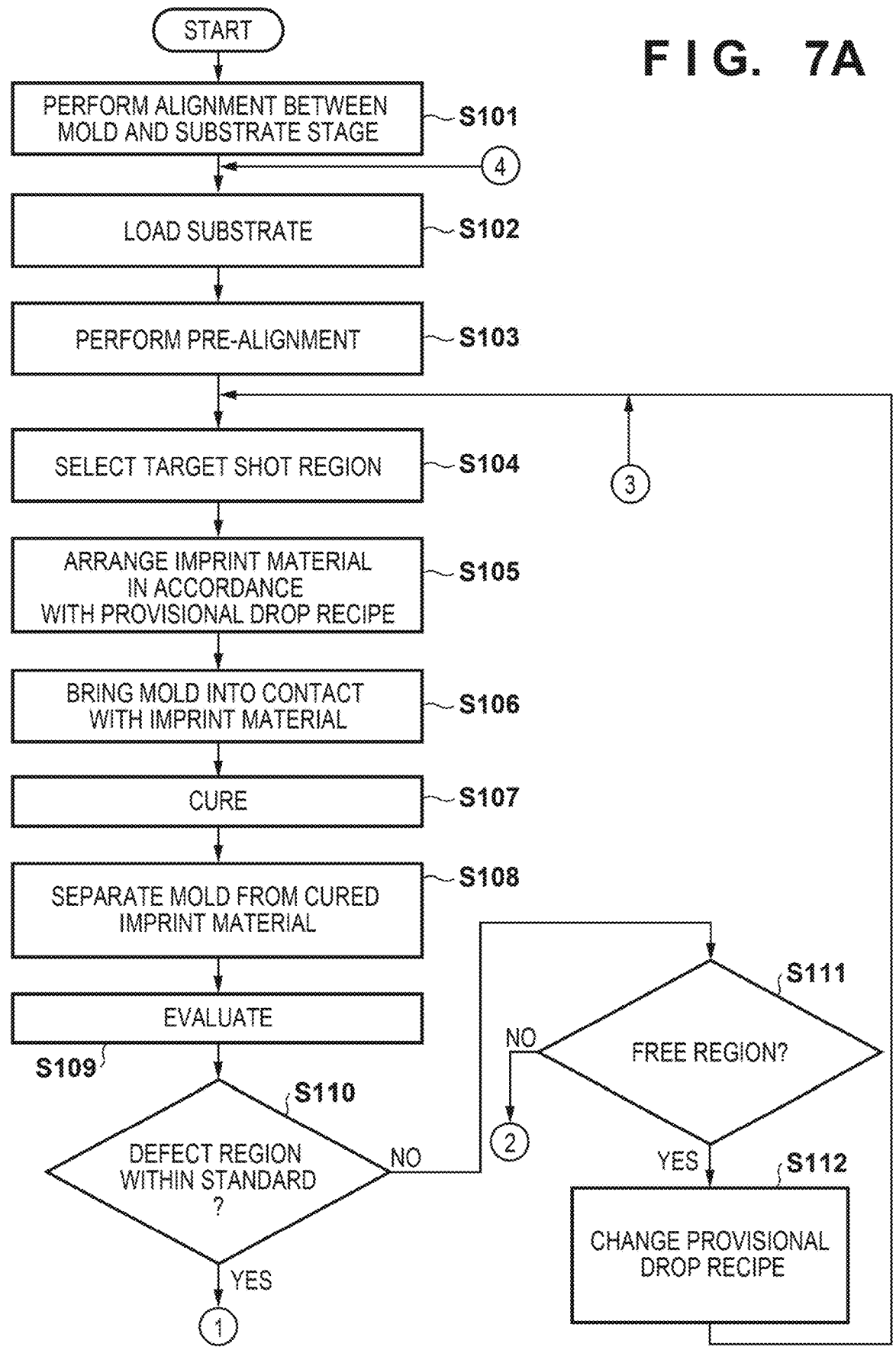
FIGS. 7A and 7B show a flowchart showing a more detailed example of the procedure for the drop recipe generation method performed by the imprint apparatus.
Figure 7B:
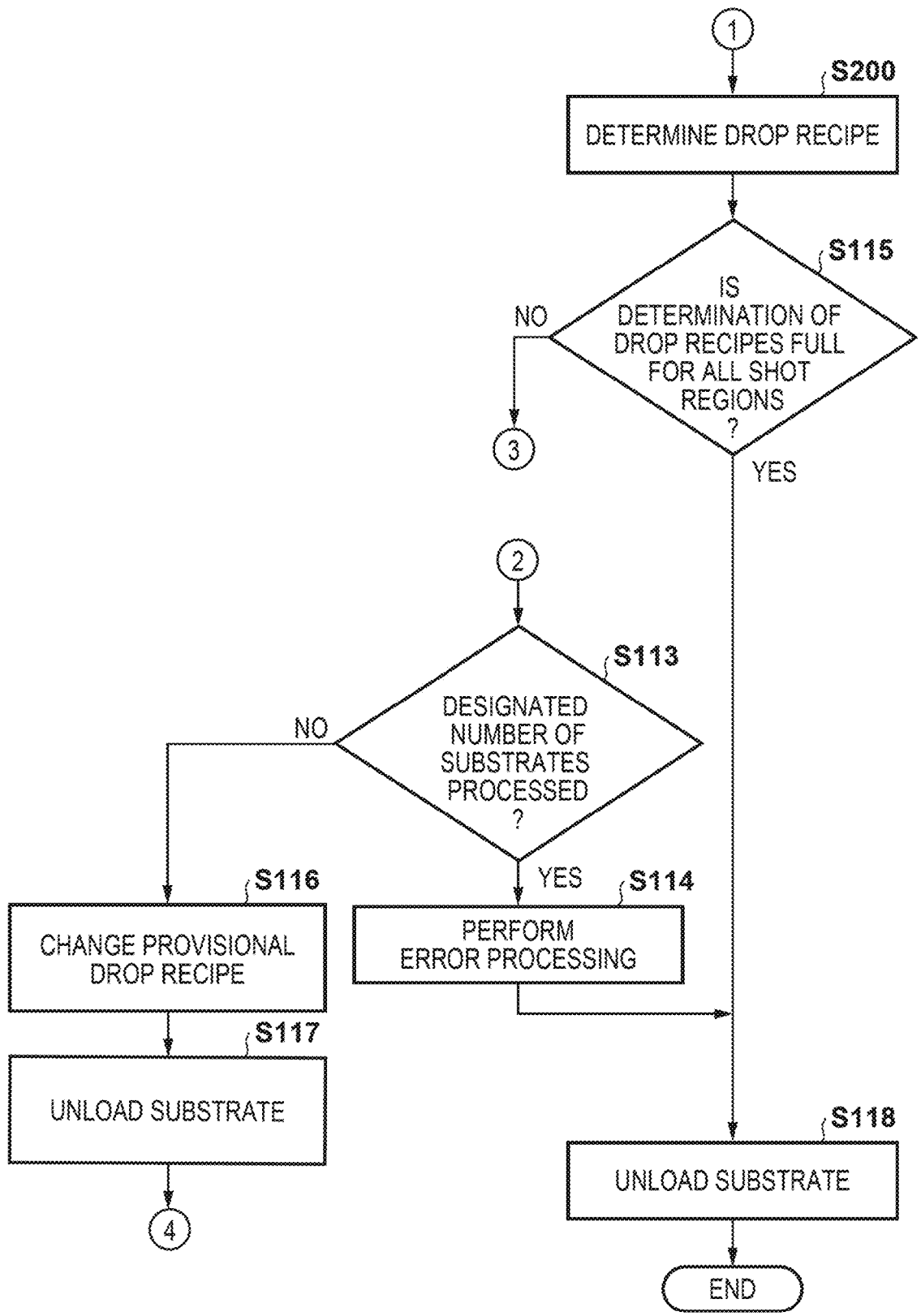
Figure 8:
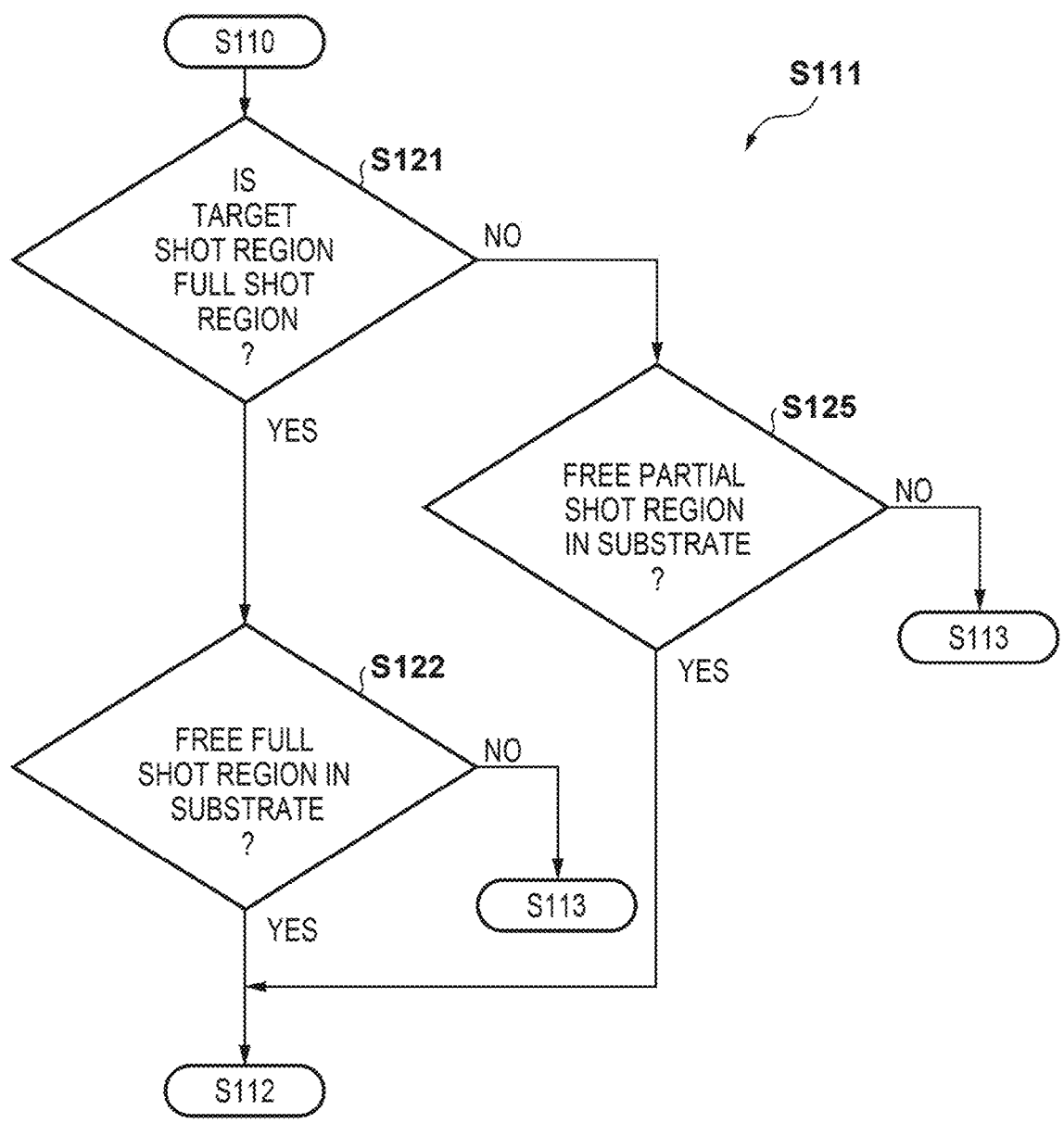
FIG. 8 is a flowchart showing a more detailed example of the procedure for the drop recipe generation method performed by the imprint apparatus.

Each of FIGS. 7A, 7B, and 8 shows a more detailed example of the procedure for the drop recipe generation method performed by the imprint apparatus 200. This operation is controlled by the controller 400. In FIGS. 7A and 7B, steps S101 to S118 correspond to step S10, and step S200 corresponds to step S20. In step S101, the main controller 410 causes the imprint controller 430 to perform alignment between the mold 18 and the substrate stage 7. More specifically, the mold 18 is loaded to the imprint apparatus 200 by a mold conveyance system (not shown), transferred to the mold chuck 17, and held by the mold chuck 17. Then, the mold 18 and the substrate stage 7 are aligned by using the alignment measurement device 12. Note that a mark detected by the alignment measurement device 12 may be provided on the substrate stage 7 as a dedicated reference mark or may be provided on a dedicated alignment substrate.

In step S102, the main controller 410 causes the imprint controller 430 to load the substrate 1. The substrate 1 is held by the substrate chuck of the substrate stage 7. In step S103, the main controller 410 causes the imprint controller 430 to perform pre-alignment. In pre-alignment, the substrate 1 is moved below the off-axis scope 24, and the off-axis scope 24 measures the position of the substrate 1. Pre-alignment is a process of measuring the relative positions of the mold 18 and the respective shot regions of the substrate 1.

In step S104, based on the shot layout information contained in the process recipe, the main controller 410 selects a shot region targeted for the imprint process (target shot region). In step S105, the main controller 410 causes the imprint controller 430 to perform arrangement processing of the imprint material. In the arrangement processing, the imprint controller 430 controls movement of the substrate stage 7 and discharge of the imprint material IM from the imprint material supply 23 such that the imprint material IM is arranged in the target shot region in accordance with the provisional drop recipe. At this stage, the gas supply 21 can supply the filling gas to the space between the mold 18 and the substrate 1.

In step S106, the main controller 410 causes the imprint controller 430 to perform a contact process between the mold 18 and the imprint material IM on the target shot region of the substrate 1. In this contact process, the imprint controller 430 moves the mold head 16 downward to bring the pattern surface P of the mold 18 into contact with the imprint material IM on the target shot region. The imprint controller 430 also causes the alignment measurement device 12 to measure the relative positions of the target shot region and the mold 18, and performs alignment between the target shot region and the mold 18 based on the result. Such alignment is called die-by-die alignment.

In step S107, the main controller 410 causes the imprint controller 430 to perform a curing process of the imprint material IM. In the curing process, the imprint controller 430 controls the curing light source 11 so as to irradiate the imprint material IM with curing light. Consequently, the imprint material IM is cured, and a pattern made of the cured imprint material IM is formed on the target shot region.

In step S108, the main controller 410 causes the imprint controller 430 to perform a separation process of the mold 18 from the imprint material IM on the target shot region of the substrate 1. In this separation process, the imprint controller 430 moves the mold head 16 upward to separate the mold 18 from the cured imprint material IM on the target shot region of the substrate 1. Consequently, a pattern corresponding to the pattern surface P of the mold 18 remains on the target shot region of the substrate 1. That is, the pattern corresponding to the pattern surface P of the mold 18 is formed on the target shot region of the substrate 1. When the mold 18 is separated from the cured imprint material IM, the mold head 16 is moved upward while maintaining a shearing stress acting on the pattern surface P of the mold 18 equal to or smaller than the rupture stress of the pattern made of the cured imprint material IM so as not to rupture the pattern.

In step S109, the main controller 410 causes the off-axis scope 24 to capture the pattern made of the cured imprint material IM on the target shot region and based on image data obtained by this, evaluates the quality of the pattern. In this embodiment, this evaluation includes the evaluation of the size of a defect region extracted from the image data. In step S110, the main controller 410 determines whether the size of the defect region whose pattern is evaluated in step S109 falls within a standard (satisfies a predetermined condition). Then, the process advances to step S200 if the size of the defect region falls within the standard, and the process advances to step S111 if the size falls outside the standard.

FIG. 8 shows the details of step S111. First, steps S111 to S118 will schematically be described with reference to FIGS. 7A and 7B. In step S111, it is determined whether a free region to arrange the imprint material and form a pattern exists on the current substrate 1. The process advances to step S112 in a case where the free region of a shot region whose drop recipe is not determined exists, and the process advances to step S113 in a case where the free region does not exist. The shot region whose drop recipe is not determined can be a free region of a partial shot region and/or a free region of a full shot region. In step S112, the main controller 410 causes the drop recipe generator 420 to change the provisional drop recipe and returns to step S104. The drop recipe generator 420 changes a current provisional drop recipe (latest drop recipe) based on the result of the evaluation in step S109. The process that returns to step S104 from step S111 through step S112 means iterating steps S104 to S110 by using a current substrate in a case where a free region to arrange the imprint material and form a pattern in accordance with the provisional drop recipe after the change exists on the current substrate.

In step S113, the main controller 410 determines whether the preset designated number ("Continual Wafer Number" to be described later) of substrates has been processed and advances to step S114 in a case where the designated number of substrates has already been processed. On the other hand, in a case where the designated number of substrates has not been processed yet, the main controller 410 advances to step S116. Note that the fact that the designated number of substrates has already been processed means that an abnormal region does not fall within the standard though the designated number of substrates has been processed, that is, a determination of an appropriate drop recipe fails. In step S114, the main controller 410 outputs error information to the user interface 34 and/or the integrated computer 300. The error information can contain information indicating a failure in determination of the appropriate drop recipe. In step S112, the main controller 410 changes the current provisional drop recipe (latest drop recipe) based on the result of the evaluation in step S109 and returns to step S104.

In step S116, the main controller 410 causes the drop recipe generator 420 to change the provisional drop recipe. The drop recipe generator 420 changes the current provisional drop recipe (latest drop recipe) based on the result of the evaluation in step S109. In step S117, the main controller 410 causes the imprint controller 430 to unload the substrate 1 and returns to step S102. The process that returns to step S102 from step S113 through step S117 means iterating steps S104 to S110 by using the current substrate in a case where the free region to arrange the imprint material and form the pattern in accordance with the provisional drop recipe after the change does not exist on the current substrate. Thus, in this embodiment, while the repeating is performed by using the substrate 1 after the substrate chuck (substrate holder) of the imprint apparatus holds the substrate 1 in step S102, a state in which the substrate holder holds the substrate 1 is maintained.

If it is determined in step S110 that the size of the defect region whose pattern is evaluated in step S109 falls within the standard, the main controller 410 determines the current drop recipe (latest drop recipe) as a conditioned drop recipe in step S200. In step S115, the main controller 410 determines whether drop recipes have been determined for all shot regions and advances to step S118 if it determines that the drop recipes have been determined for all the shot regions. On the other hand, if the main controller 410 determines that the drop recipes have not been determined for all the shot regions yet, it returns to step S104.

In step S118, the main controller 410 causes the imprint controller 430 to unload the substrate 1. Thus, in this embodiment, while the repeating is performed by using the substrate 1 after the substrate chuck (substrate holder) of the imprint apparatus holds the substrate 1 in step S102, the state in which the substrate holder holds the substrate 1 is maintained.

Step S111 will be described in detail next with reference to FIG. 8. In step S121, the main controller 410 determines whether the target shot region is a full shot region or a partial shot region. Then, the main controller 410 advances to step S122 if the target shot region is the full shot region and advances to step S125 if the target shot region is the partial shot region.

In step S122, the main controller 410 determines whether a free full shot region exists on the current substrate 1. The process advances to step S112 in a case where the full shot region exists and advances to step S113 in a case where the full shot region does not exist.

The main controller 410 determines in step S125 whether a free partial shot region whose drop recipe is not determined exists on the current substrate 1 and advances to step S112 in a case where the free partial shot region exists on the current substrate 1. On the other hand, in a case where the free partial shot region does not exist on the current substrate 1, the main controller 410 advances to step S113.

Note that more substrates can be needed in repeating for determining the drop recipes for the partial shot regions than in repeating for determining the drop recipe for the full shot regions. Therefore, the main controller 410 may entirely or partially perform the repeating for determining the drop recipes for the partial shot regions by using the full shot regions. This can be done by performing the imprint process on the full shot regions by using the provisional drop recipes for the partial shot regions and evaluating a pattern formed by this.

A process of generating the drop recipes for the partial shot regions will be captured below with reference to FIGS. 17A, 17B, 17C, 7A, 7B, and 8. FIG. 17A exemplifies the first substrate for determining the drop recipes for the partial shot regions. FIG. 17B exemplifies the second substrate for determining the drop recipes for the partial shot regions. FIG. 17C exemplifies the third substrate for determining the drop recipes for the partial shot regions.

Each partial shot region indicated by a solid line is a partial shot region determined in step S110 that the size of the defect region falls outside the standard (rejection). Each partial shot region indicated by a broken line is a partial shot region determined in step S110 that the size of the defect region falls within the standard (acceptance). Note that a determination that the size of the defect region falls outside the standard (rejection) means that a current drop recipe for the partial shot region needs to be changed. On the other hand, a determination that the size of the defect region falls within the standard (acceptance) means that the current drop recipe for the partial shot region can be determined as a conditioned drop recipe. Each partial shot region indicated by an alternate long and short dashed line is a partial shot region which has drop recipe already determined and falls outside the drop recipe conditioning targets.

In a process for the Nth substrate, which of shot regions to be an imprint target shot region can be determined in step S104 based in the shot layout information contained in the process recipe and processing order information. The processing order information is information indicating a specific order of processing a plurality of shot regions in the shot layout information, and is indicated by figures each described in a rectangle indicating the shot region in FIGS. 17A, 17B, and 17C. Regarding the shot region determined in step S110 that the size of the defect region falls within the standard, a shot region number thereof is reflected on the process recipe and excluded from a candidate for the imprint target shot region in step S104 of a process for the (N+1)th substrate.

Based on a determination result with respect to the first substrate shown in FIG. 17A, on the second substrate, shot regions having shot region number=22 and shot region number=32 are excluded from imprint target shot regions. Based on a determination result with respect to the second substrate shown in FIG. 17B, on the third substrate, shot regions having shot region numbers=22, 25, 32, 39, and 40 are excluded from imprint target shot regions. Based on a determination result with respect to the third substrate shown in FIG. 17C, on the fourth substrate (not shown), shot regions having shot region numbers=22, 25, 32, 34, 36, 39, and 40 are excluded from imprint target shot regions.

The sequence of drop recipe determination processing shown in FIGS. 7A and 7B in a case in which the determination results shown in FIGS. 17A, 17B, and 17C are obtained will be described. In step S104 which is performed first on the first substrate used for the process of determining the drop recipes for the partial shot regions, the shot region having shot region number=22 which is the smallest shot region number is selected. Regarding the shot region having shot region number=22, it is determined in step S110 that the size of the defect region falls within the standard, and the provisional drop recipe is determined as the conditioned drop recipe in step S200. Then, the drop recipes have not been determined yet for all the shot regions on the first substrate in step S115, and thus the process advances to step S104 in which the shot region having shot region number=23 which is the smallest shot region number next to shot region number=22 is selected. Regarding the shot region having shot region number=23, it is determined in step S110 that the size of the defect region falls outside the standard, it is determined in step S121 within step S111 that the target shot region is not the full shot region, and the process advances to step S125. In step S125, shot region number=23 is not shot region number=44 as a final shot region in the substrate, and thus the process advances to step S112. In step S112, the provisional drop recipe is changed, and the process advances to step S104. In step S104, the shot region having shot region number=24 which is the smallest shot region number next to shot region number=23 is selected. As described above, the drop recipe determination processing for the partial shot regions of the first substrate is performed.

On the second substrate used to determine the drop recipes for the partial shot regions, in step S104, shot region number=23 is determined as the smallest shot region number whose optimal drop recipe is not determined. Similarly to the first substrate, on the second substrate, a process for determining drop recipes for shot regions other than those having shot region numbers 23 and 32 is performed.

Detection of a defect region and a method of changing a provisional drop recipe (method of determining a drop recipe) will be described below. A change of the provisional drop recipe (determination of the drop recipe) can be made by the drop recipe generator 420. The types of defect regions can include an unfilled defect region in which the imprint material IM is not filled between the mold 18 and the substrate 1, and a protrusion defect region in which the imprint material IM protrudes from a shot region. First, the method of changing the provisional drop recipe for reducing the unfilled defect region that may occur in an alignment mark arranged in the vicinity of the outer edge of a shot region will exemplarily be described with reference to FIGS. 9A and 9B.

Figure 9A:
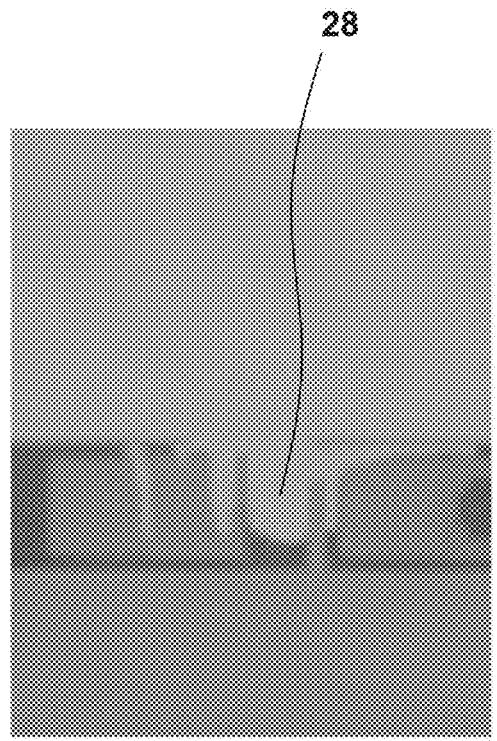
FIGS. 9A and 9B are views showing a method of changing a provisional drop recipe for reducing an unfilled defect that may occur in an alignment mark arranged in the vicinity of the outer edge of a shot region.

FIG. 9A exemplifies image data obtained by capturing the pattern made of the cured imprint material on the shot region by the off-axis scope 24 in step S109. Note that the image data may be obtained for an entire shot region by the off-axis scope 24 or may be obtained for a designated partial region out of the entire shot region by the off-axis scope 24. The partial region can be designated by an input by the user to "Detect Area <1>" to "Detect Area <5>" to be described later. The partial region can be designated for a region which is likely to be a defect region empirically or statistically. The region which is likely to be the defect region empirically or statistically is, for example, near the outer edge of each of the full shot regions and the partial shot regions. The partial shot regions which are likely to be defective regions empirically or statistically are regions in the vicinity of the substrate edge.

Figure 9B:
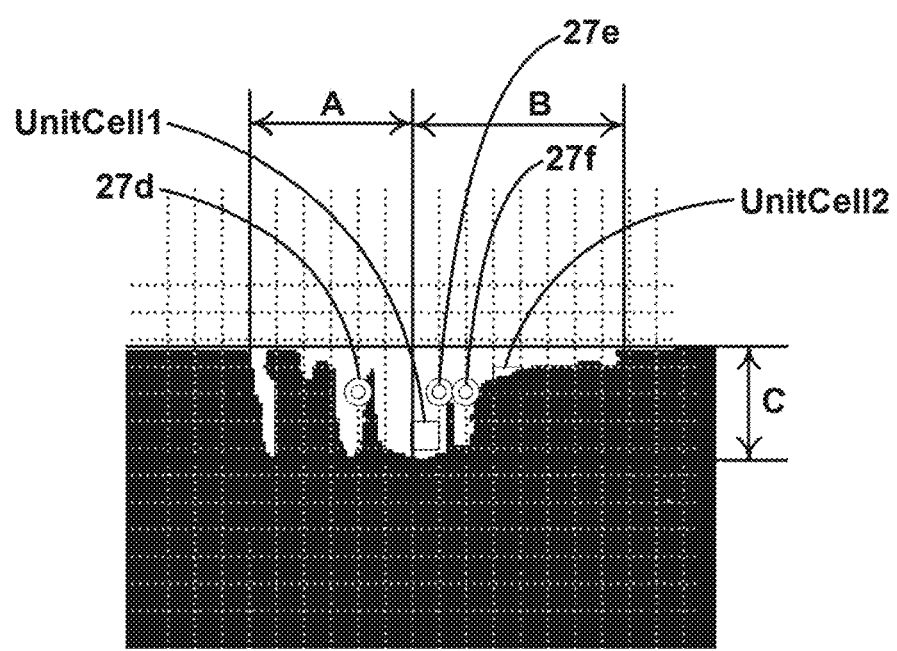

FIG. 9B exemplifies binary image data obtained by causing the drop recipe generator 420 to binarize image data obtained by the off-axis scope 24. The drop recipe generator 420 compares the binary image data with preset reference image data, determines the presence/absence of a defect for each unit region, and calculates the area of a defect region 28 (unfilled defect region). Each unit region is a unit of determining the presence/absence of the defect and indicated as a rectangular region defined by a grid in FIG. 9B. The area of the defect region 28 (unfilled defect region) can be obtained by counting the unit regions having defects (unfilled defects). In FIG. 9B, UnitCell1 is a unit region an entire area of which has a defect, and UnitCell2 is a unit region a part of which has a defect.

The drop recipe generator 420 can change the provisional drop recipe by:

step 1: calculate the number of droplets based on the area of a defect region and various kinds of information (equation (1))

step 2: divide the defect region by the calculated number of droplets and determine divided regions step 3: calculate a barycentric position for each divided region (equation (2)) to (equation (4))

step 4: arrange droplets in an unarranged grid closest to the barycentric position In step 1, the drop recipe generator 420 can calculate the number of droplets in accordance with:

number of droplets=area of defect region×(RLT+Pd× uneven ratio of defect region)÷one drop    (1)

where RLT is the Residual Layer Thickness, Pd is the Pattern Depth, one drop is the liquid amount of an imprint material discharged from the orifices 33 of FIG. 3 in one-time discharge, and the uneven ratio is the uneven ratio of the pattern of the mold 18 which is defined such that 0% is given when the pattern has all convexes, and 100% is given when the pattern has all concaves.

In step 3, the drop recipe generator 420 can calculate the barycentric position in accordance with:

$$Wt = \Sigma Wi \quad (2)$$

$$Xg = (\Sigma(Xi \times Wi)) \div Wt \quad (3)$$

$$Yg = (\Sigma(Yi \times Wi)) \div Wt \quad (4)$$

where Wt is a gross weight, (Xg, Yg) is a barycentric position, (Xi, Yi) are the central coordinates of the divided region, Wi is the weight of the divided region, and 1 to n are divided region numbers.

Regarding the weight of the divided region, the percentage thereof is assigned as 100 if the entire unit regions have defects and in the range of 0 to 100 if one out of all the unit regions has a defect.

FIG. 9B shows an example in which an approximate integer of the number of droplets calculated by equation (1) is 2. A defect region is divided into a solid-white divided region designated by A and C, and a solid-white divided region designated by B and C.

Assuming that the imprint material spreads evenly on a plane, a method of dividing the defect region can be a method of segmenting the defect region such that a variation in distance from a barycenter to a boundary becomes the smallest. Alternatively, the method of dividing the defect region may be Centroidal Voronoi Tessellation disclosed in Japanese Patent Laid-Open No. 2012-506600 or may be another method. In addition, considering the property of the imprint material that tends to spread in a direction along the direction of a mold pattern, a method of making the length of the divided region in the direction of the mold pattern longer than that in a direction perpendicular to the direction of the mold pattern is also useful.

In the example of FIG. 9B, in a solid-white region designated by A and C, an additional droplet is arranged at a position 27d closest to a barycentric position. In a solid-white region designated by B and C, a closest proximal unarranged position 27e is selected if a position 27f is calculated as a position closest to the barycentric position, and a droplet has already been arranged at the position 27f.

Figure 10A:
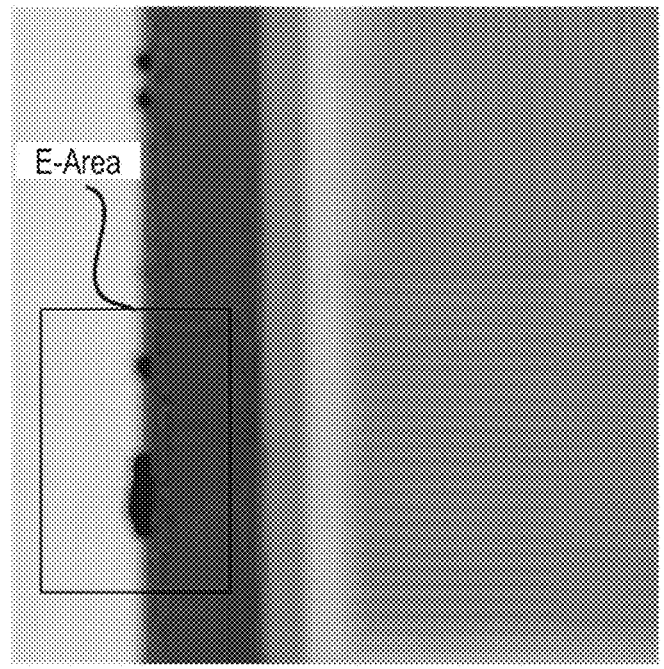
FIGS. 10A and 10B are views exemplifying a method of changing a provisional drop recipe for reducing protrusion of the imprint material that occurs at the outer edge of the shot region.

A method of changing a provisional drop recipe for reducing protrusion of the imprint material that occurs at the outer edge of the shot region will exemplarily be described below with reference to FIGS. 10A and 10B. FIG. 10A exemplifies image data obtained by capturing the pattern made of the cured imprint material on the shot region by the off-axis scope 24 in step S109.

E-Area is image data of a portion where protrusion occurs in the peripheral region of the shot region. FIG. 10B exemplifies binary image data obtained by enlarging and binarizing the image data. The drop recipe generator 420 compares the binary image data with preset reference image data, determines the presence/absence of a defect for each unit region, and calculates the area of a defect region (protrusion defect region).

Figure 10B:
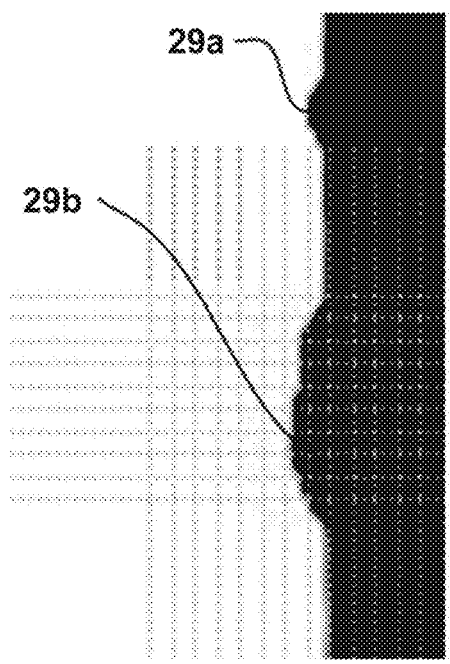

The drop recipe generator 420 can change the provisional drop recipe in steps 1 to 5 below. Note that in this example, a description will be given below in a case in which an approximate integer of the calculated number of droplets is 2.

step 1: calculate the number of droplets from the area of the defect region and various kinds of information (equation (1))

step 2: divide the defect region by the number of droplets and determine divided regions step 3: calculate a barycentric position for each divided region (equation (2)) to (equation (4))

step 4: extract a droplet arranged on a periphery closest to the barycentric position step 5: move the droplets arranged on the periphery to the central direction of the shot region FIG. 10B shows an example in which the approximate integer of the number of droplets calculated by equation (1) is 2. In the example of FIG. 10B, a region 29a is an area which is judged to fall within a designated allowance (protrusion area) and which is not to be corrected. A region 29b is an area which is judged as a protrusion defect region deviated from the designated allowance and which is to be corrected.

Figure 11:
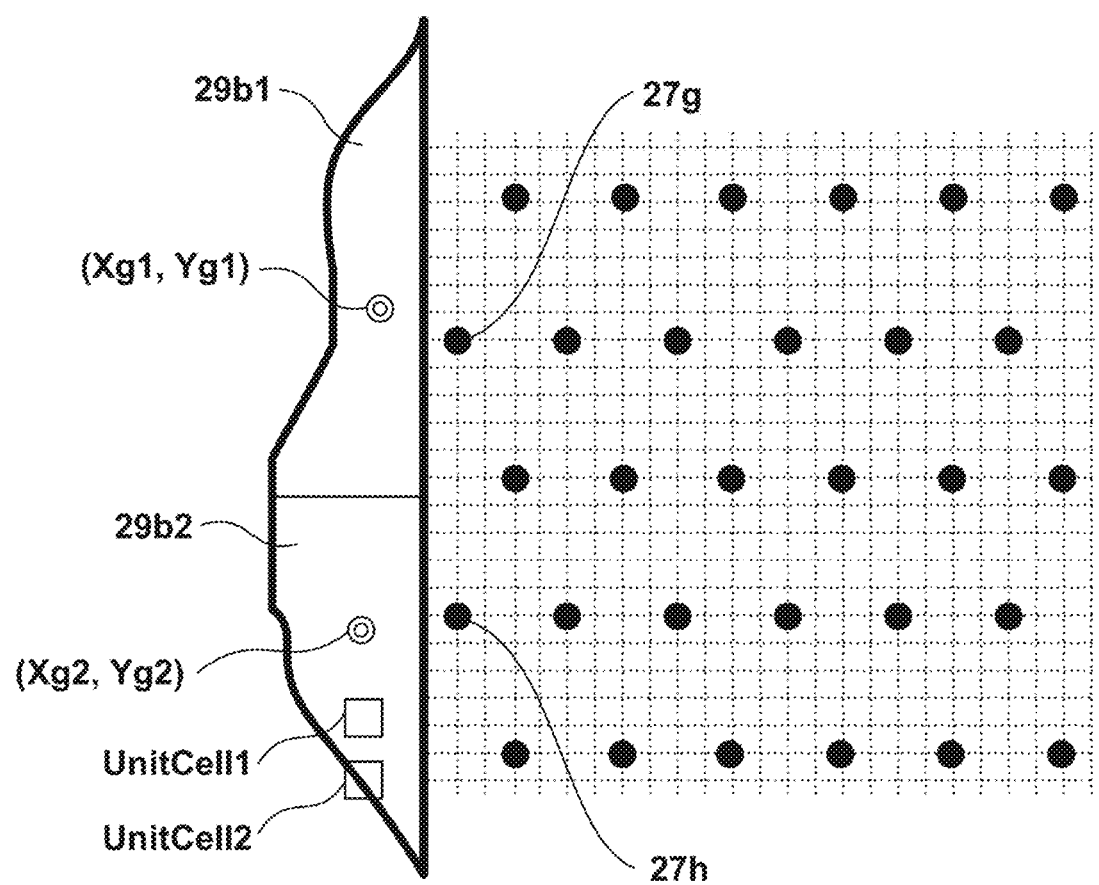
FIG. 11 is a view exemplifying the method of changing the provisional drop recipe for reducing protrusion of the imprint material that occurs at the outer edge of the shot region.
Figure 12A:
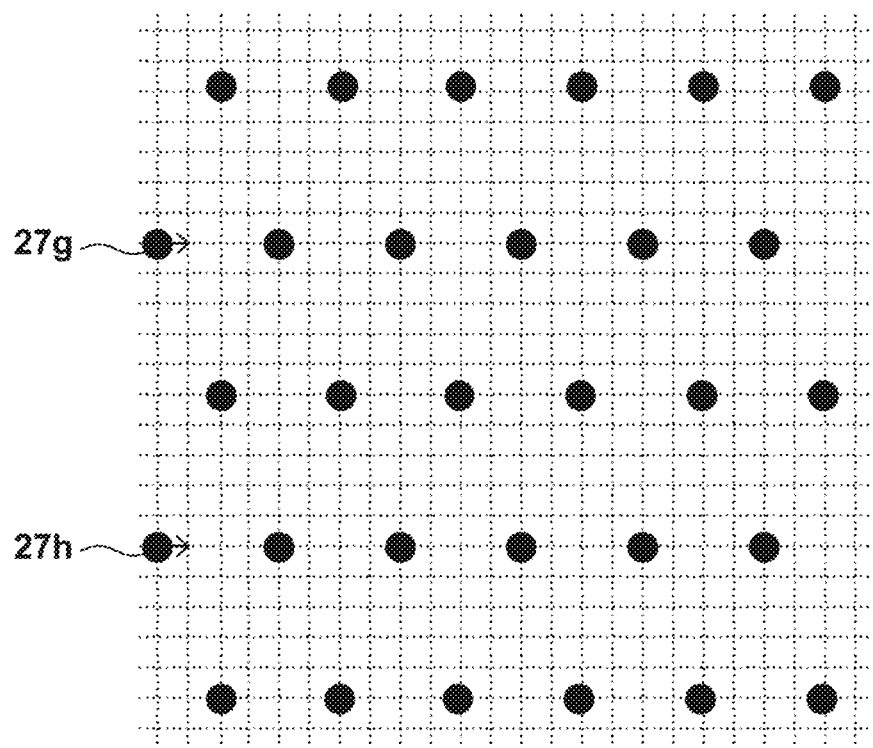
FIGS. 12A and 12B are views exemplifying the method of changing the provisional drop recipe for reducing protrusion of the imprint material that occurs at the outer edge of the shot region.
Figure 12B:
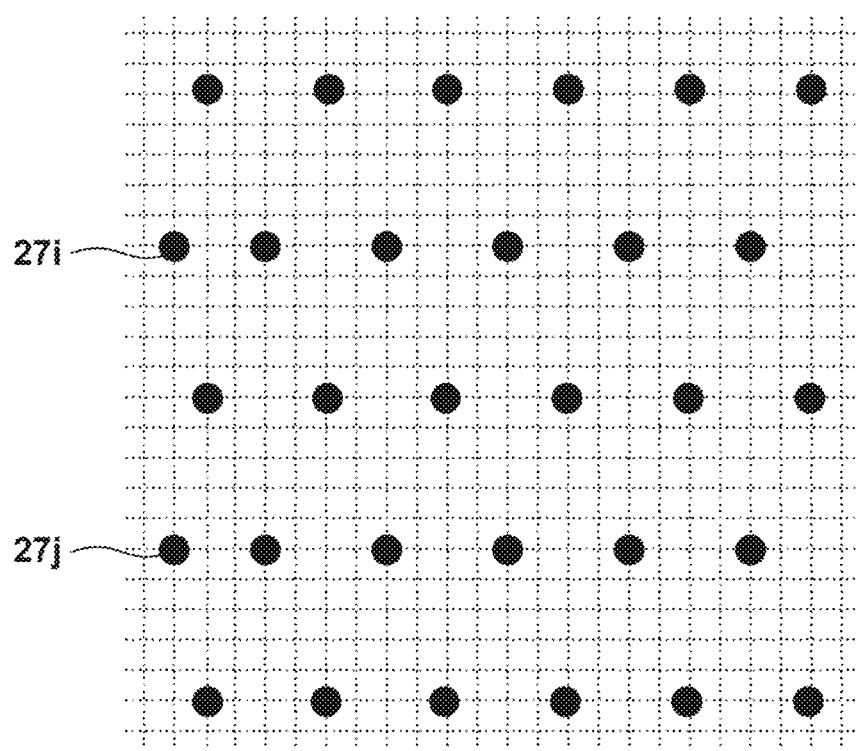

FIG. 11 exemplifies the positional relationship between the region 29b (protrusion defect region deviated from the allowance) in FIG. 10B and a droplet arrangement in its vicinity. A region 29b and a region 29b2 are divided regions obtained by dividing the region 29b determined as the protrusion defect region by 2 which is the approximate integer of the number of droplets calculated by equation (1). Barycentric positions of respective partial regions are (Xg1, Yg1) and (Xg2, Yg2). Note that a position of a droplet in the provisional drop recipe before a change closest to (Xg1, Yg1) is a position 27g. A position of a droplet in the provisional drop recipe before the change closest to (Xg2, Yg2) is a position 27h. FIG. 12A exemplifies the provisional drop recipe before the change. FIG. 12B exemplifies the provisional drop recipe after the change. The provisional drop recipe after the change exemplified in FIG. 12B is obtained by moving the positions 27g and 27h in FIG. 12A to positions 27i and 27j in the central direction of the shot region where droplets can be arranged.

Figures 13, 14:
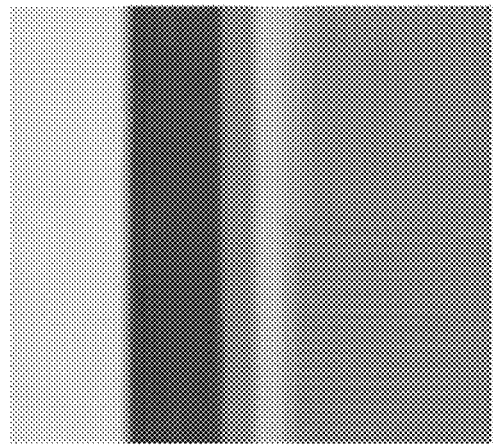
FIG. 13 is a view exemplifying image data obtained by capturing a pattern formed in accordance with the provisional drop recipe after a change.
FIG. 14 is a view exemplifying a setting screen provided by a user interface.

FIG. 13 exemplifies image data obtained by the off-axis scope 24 in step S109 as a result of performing steps S104 to S109 in accordance with the provisional drop recipe after the change described with reference to FIGS. 10A, 10B, 11, 12A, and 12B. No defect region exists in FIG. 13.

A method of canceling a protrusion region by moving a droplet if a protrusion defect region exists has been exemplified here. However, a method of calculating the number of droplets corresponding to a protrusion region and deleting droplets in the vicinity of the protrusion region is also useful.

FIG. 14 exemplifies a setting screen provided by the user interface 34. Through this setting screen, the user can set a condition for conditioning a drop recipe. Settable items on the setting screen will be described below. A "Max Iteration Count of One Wafer" is a parameter that designates the number of times steps S104 to S109 are iterated for one substrate while changing a target shot region. In step S111, the presence/absence of the free region can be determined based on the "Max Iteration Count of One Wafer". A "Detect Tolerance Local Area" is a parameter that designates an allowance (standard) of the area of one defect region. In step S110, whether the area of the defect region falls within the standard can be determined based on the "Detect Tolerance Local Area". In step S110, it can be determined that the area of the defect region does not fall within the standard if there exists even one defect region that exceeds the "Detect Tolerance Local Area".

A "Defect Tolerance Total Area" is a parameter that designates an allowance (standard) for the total area of all defect regions of a target shot region. In step S110, whether the total area of the defect regions falls within the standard can be determined based on the "Defect Tolerance Total Area". "Detect Area <1> UL/DR" to "Detect Area <5> UL/DR" are parameters each for designating an examination target region to undergo an examination of a defect in a shot region. Each examination target region is set as a rectangular region designated by upper left coordinates (UL) and lower right coordinates (DR). Note that <1> to <5> indicate an order to make examinations. An "Add Detect Area" is a check box for giving an instruction to add an examination target region. If this check box is checked, "Detect Area <X> UL/DR" is added.

A "Shot Peripheral Check" is a check box for setting whether to make an examination of an external region of a mold pattern. If this check box is checked, the examination of the external region of the mold pattern is made. A "Continual Wafer Number" is a parameter for designating the number of substrates used to determine a drop recipe. In step S113, it is determined, based on the "Continual Wafer Number", whether the designated number of substrates has been processed. An "FF Recipe Name" is an input region for setting a conditioning recipe name for determining a drop recipe for full shot regions (FF shot regions). A "PF Recipe Name" is an input region for setting a conditioning recipe name for determining drop recipes for partial shot regions (PF shot regions).

In an example of FIG. 14, a region to undergo a defect examination is input by a screen operation by the user. However, an experiment reveals that regions where defects are likely to occur are a mold pattern boundary region, an alignment mark position, and its vicinity. In order to designate such specific regions, the controller 400 may obtain design information of the mold from the user interface 34 or the integrated computer 300 by the input/output interface 440 and designate the specific regions based on this design information. This method saves the user from having to set an examination region, making it possible to determine a drop recipe efficiently. The mold pattern boundary region is a region where respective region blocks are close to each other if pattern line widths are different depending on the region blocks, or if pattern directions are different depending on the region blocks.

A pattern of a cured product formed by using an imprint apparatus is used permanently for at least some of various articles or used temporarily when the various articles are manufactured. The article includes an electric circuit element, an optical element, a MEMS, a recording element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The optical element includes a microlens, a light-guiding member, a waveguide, an antireflection film, diffraction grating, a light polarization element, a color filter, a light emitting element, a display, a solar battery, or the like. The MEMS includes a DMD, a microchannel, an electromechanical transducer, or the like. The recording element includes an optical disk such as a CD or DVD, a magnetic disk, a magnetooptical disk, a magnetic head, or the like. The sensor includes a magnetic sensor, an optical sensor, a gyro sensor, or the like. The mold includes an imprint mold or the like.

The pattern of the cured product is used without any change as a constituent member of at least a part of the above-described article or used temporarily as a resist mask. The resist mask is removed after etching, ion implantation, or the like is performed in a processing step of the substrate.

Figure 15A:
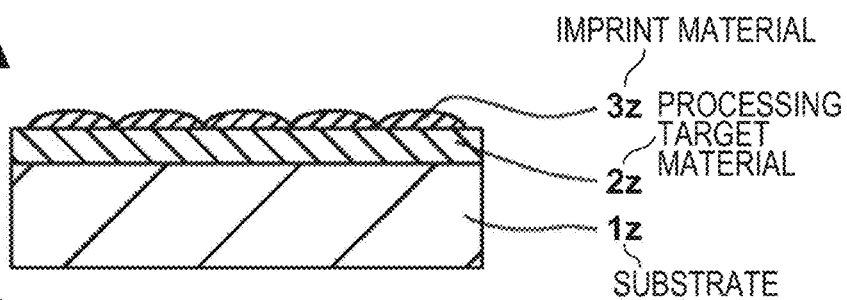
FIGS. 15A to 15F are views exemplifying an article manufacturing method.

An article manufacturing method of forming a pattern on a substrate by an imprint apparatus, processing the substrate on which the pattern has been formed, and manufacturing an article from the substrate on which the process has been performed will be described next. As shown in FIG. 15A, a substrate 1z such as a silicon wafer having a processing target material 2z such as an insulator formed on its surface is prepared, and then an imprint material 3z is applied on the surface of the processing target material 2z by an inkjet method or the like. A state is shown here in which the imprint material 3z formed into a plurality of droplets is applied on the substrate.

Figure 15B:
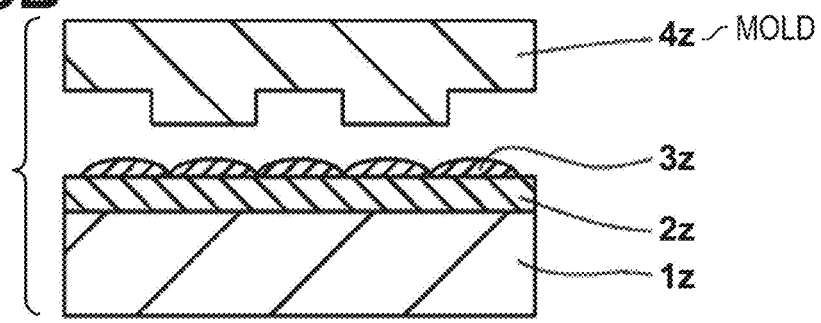
Figure 15C:
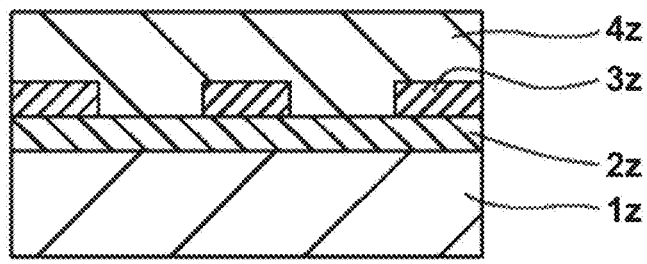

As shown in FIG. 15B, a side of an imprinting mold 4z on which its three-dimensional pattern is formed faces the imprint material 3z on the substrate. As shown in FIG. 15C, a mold 4z and the substrate 1z to which the imprint material 3z is applied are brought into contact with each other, and a pressure is applied. The imprint material 3z fills the gap between the mold 4z and the processing target material 2z. The imprint material 3z is cured by irradiating it with light as curing energy through the mold 4z in this state.

Figure 15D:
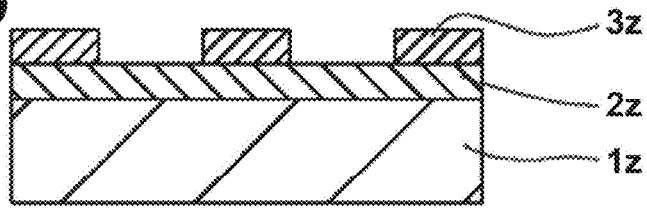

As shown in of FIG. 15D, the pattern of the cured product of the imprint material $3z$ is formed on the substrate $1z$ by releasing the mold $4z$ and the substrate $1z$ from each other after curing the imprint material $3z$. The pattern of this cured product has a shape such that the concave portion of the mold corresponds to the convex portion of the cured product, and the convex portion of the mold corresponds to the concave portion of the cured product. That is, the three-dimensional pattern of the mold $4z$ is transferred to the imprint material $3z$.

Figure 15E:
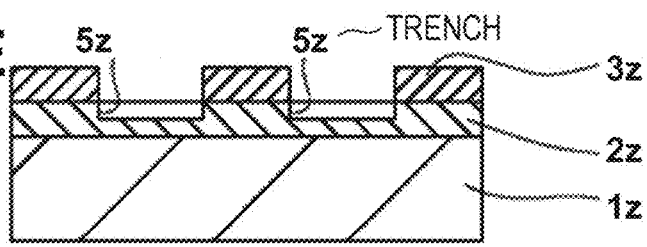
Figure 15F:
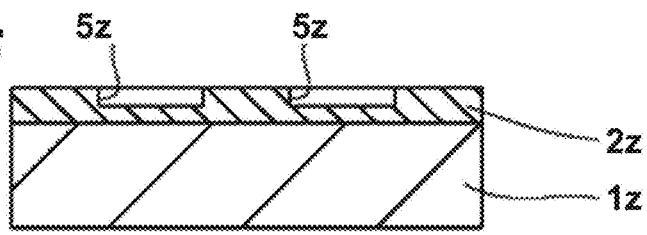

As shown in of FIG. 15E, out of the surface of the processing target material $2z$, portions without any cured product or portions where the cured products remain thin are removed and become trenches $5z$ by performing etching using the pattern of the cured product as an etching resistant mask. As shown in FIG. 15F, an article having the trenches $5z$ formed in the surface of the processing target material $2z$ can be obtained by removing the pattern of the cured product. The pattern of the cured product is removed here. However, the pattern of the cured product may be used as, for example, an interlayer dielectric film included in the semiconductor element or the like, that is, the constituent member of the article without removing it after processing.

Figure 16A:
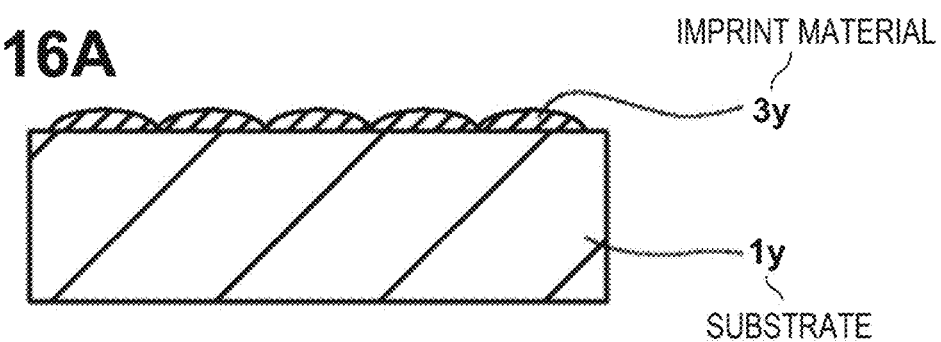
FIGS. 16A to 16D are views exemplifying another article manufacturing method.

Another article manufacturing method will be described next. As shown in FIG. 16A, a substrate $1y$ such as silica glass is prepared, and then an imprint material $3y$ is applied on the surface of the substrate $1y$ by the inkjet method or the like. A layer of another material such as a metal or a metallic compound may be provided on the surface of the substrate $1y$, as needed.

Figure 16B:
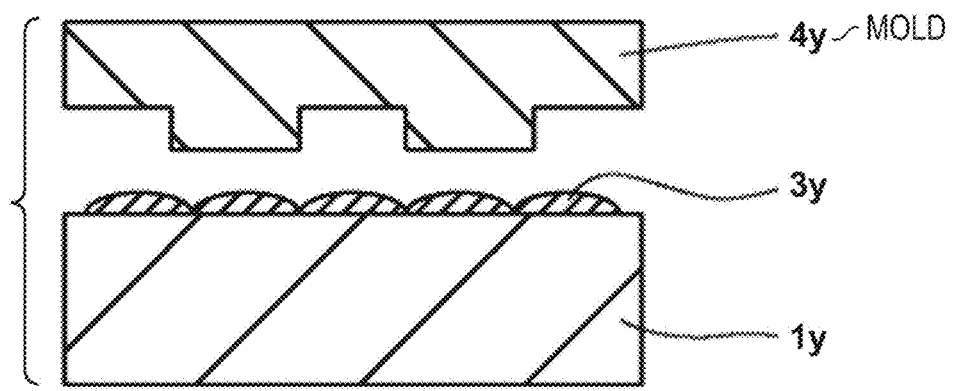
Figure 16C:
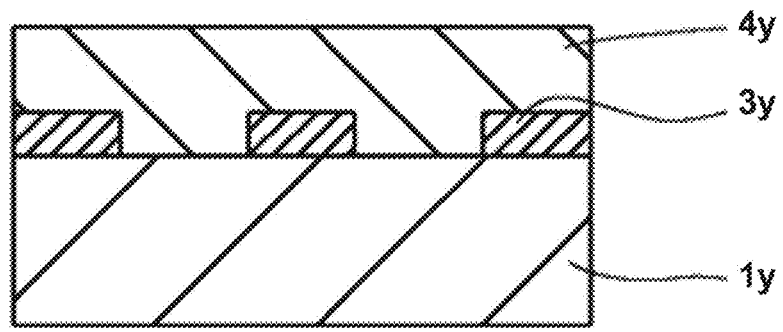

As shown in FIG. 16B, a side of an imprinting mold $4y$ on which its three-dimensional pattern is formed faces the imprint material $3y$ on the substrate. As shown in FIG. 16C, a mold $4y$ and the substrate $1y$ to which the imprint material $3y$ is applied are brought into contact with each other, and a pressure is applied. The imprint material $3y$ fills the gap between the mold $4y$ and the substrate $1y$. The imprint material $3y$ is cured by irradiating it with light through the mold $4y$ in this state.

Figure 16D:
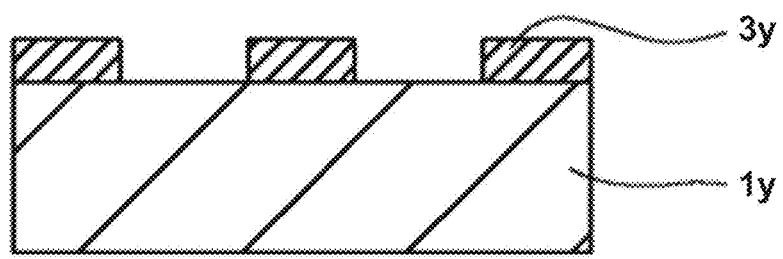

As shown in of FIG. 16D, the pattern of the cured product of the imprint material $3y$ is formed on the substrate $1y$ by releasing the mold $4y$ and the substrate $1y$ from each other after curing the imprint material $3y$. An article including the pattern of the cured product as a constituent member is thus obtained. Note that if the substrate $1y$ is etched by using the pattern of the cured product as a mask in the state of FIG. 16D, it is also possible to obtain an article with a concave portion and a convex portion being inverted with respect to the mold $4y$, for example, an imprinting mold.

The second embodiment of the present invention will be described below. Matters that are not mentioned as the second embodiment can comply with the first embodiment. A plurality of full shot regions on a substrate 1 have the same shape, and thus in general, a common drop recipe to the plurality of full shot regions can be determined. In the first embodiment, the common drop recipe for the full shot regions can be determined by performing the imprint process experimentally by using the plurality of full shot regions on the substrate and evaluating a pattern formed by this.

In the second embodiment, an optimal drop recipe is chosen or determined by performing an imprint process experimentally in accordance with different imprint conditions on a plurality of full shot regions on the substrate 1 and evaluating a pattern formed by this. The different imprint conditions can be set in a process recipe. The different imprint conditions can be set such that an imprint condition different from that in another shot region is set for individual shot regions.

Each imprint condition can include at least one of
relative positions of the substrate and a mold when alignment between the substrate and the mold is completed,
a time period from bringing the mold into contact with the imprint material to curing the mold
a pressure at the time when the mold is brought into contact with the imprint material, and
deformation in mold at the time when the mold is brought into contact with the imprint material.

Figure 18:
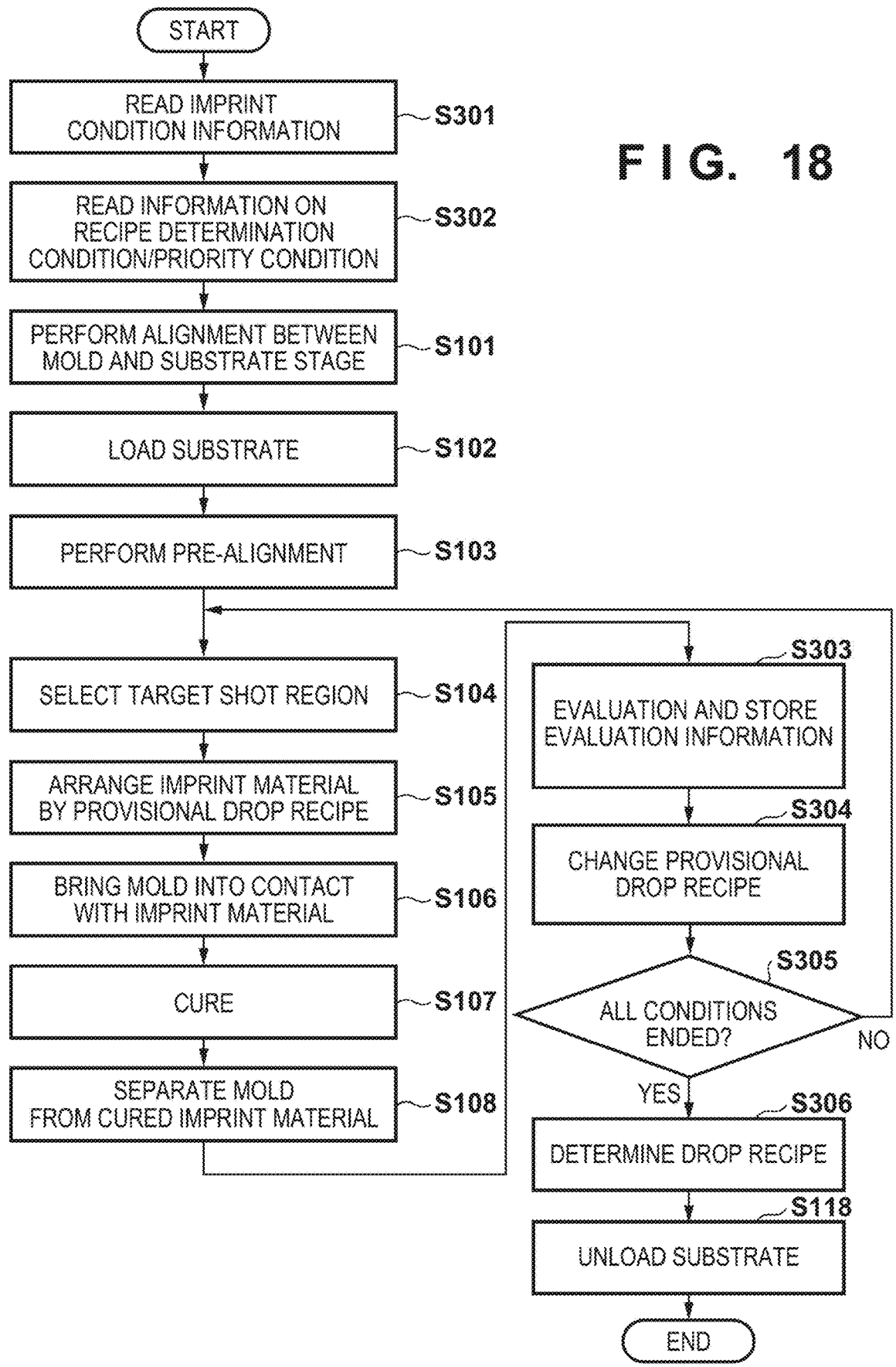
FIG. 18 is a flowchart showing a more detailed example of the procedure for a drop recipe generation method performed by an imprint apparatus.

FIG. 18 shows a detailed example of the procedure for a drop recipe generation method performed by an imprint apparatus 200 according to the second embodiment. This operation is controlled by a controller 400. Steps S101 to S108 and S118 in FIG. 18 are the same as steps S101 to S108 and S118 in FIGS. 7A and 7B, and thus a description thereof will be omitted. In step S301, the controller 400 reads imprint condition information from a process recipe and stores it as internal data.

In step S302, the controller 400 obtains information on a recipe determination condition and a priority condition from a user interface 34 or an integrated computer 300 by an input/output interface 440.

In step S303, a main controller 410 causes an off-axis scope 24 to capture a pattern made of a cured imprint material IM on a target shot region and based on image data obtained by this, evaluates the quality of the pattern.

In this embodiment, an evaluation of the quality of the pattern can include an evaluation concerning the size of a defect extracted from image data, the number of defects in each rank classified for each size of the defect, and in extrusion of the imprint material from a shot region, the total sum of the areas of extruded regions. The evaluation of the quality of the pattern can also include measuring film thicknesses of a plurality of designated portions in the target shot region by a film thickness measurement device (not shown) and obtaining a variance of measurement values. In addition, position residue information of die-by-die alignment executed in step S106 may be evaluated.

In step S304, the main controller 410 causes a drop recipe generator 420 to change a provisional drop recipe. The drop recipe generator 420 changes a current provisional drop recipe (latest drop recipe) based on a result of the evaluation of the size of a defect region extracted from image data in step S303.

In step S305, the main controller 410 determines whether a process has ended for all the imprint conditions (shot regions) and advances to step S306 if the process has ended. The main controller 410 returns to step S104 if the process has not ended. Returning to step S104 means repeating processes (steps S104 to S304) of arranging the imprint material in accordance with the provisional drop recipe after a change, and forming and evaluating a pattern for all shot regions set by a process recipe by using the substrate.

In step S306, the main controller 410 specifies a pattern which indicates an evaluation result satisfying a predetermined condition out of evaluation results of patterns formed on a plurality of shot regions. Then, the main controller 410 determines a drop recipe based on a provisional drop recipe used to arrange the imprint material for a shot region where the specified pattern has been formed.

In step S306, for example, based on priority information of preset evaluation indices, a provisional drop recipe corresponding to an imprint condition which indicates the best evaluation result on imprint conditions with all evaluation indices being within a standard is chosen and determined as a drop recipe.

In an example of FIG. 19, the priority information of the evaluation indices and standard values to be satisfied by the respective evaluation indices for choosing or determining an optimal drop recipe are input by a screen operation by a user. If a priority is input in advance in a Priority field for each evaluation index, the main controller 410 selects the best item from evaluation items with high priorities in the Priority field out of shot regions that satisfy a standard value designated in a Tolerance field.

The evaluation indices may influence each other. For example, if the imprint material is excessively arranged for the purpose of preventing a defect, a residual layer thickness may vary widely. If the imprint material is insufficiently arranged for the purpose of preventing extrusion of the imprint materials from a shot region, the residual layer thickness may vary widely in the same manner, causing a defect. If a time period from imprinting to curing as an imprint condition is prolonged, extrusion tends to increase while the number of defects tends to decrease. Tilt control of the mold and the substrate to increase alignment accuracy can change an extrusion tendency. In the manufacture of a semiconductor, depending on a pattern width, density, another tendency of the semiconductor, there can be a semiconductor device in which the alignment accuracy should be emphasized or a semiconductor device in which a variation in residual layer thickness should be emphasized. In other words, the degree of influence of the evaluation indices can change depending on a semiconductor device to be manufactured. A method of prioritizing the evaluation items and determining a drop pattern based on this can be advantageous in this case.

The main controller 410 can determine the drop recipe by the following procedure.

step 1: Shot regions with all evaluation items satisfying a criterion are extracted from all evaluated shot regions.

step 2: In the extracted shot regions, a shot region having a value of an evaluation index to be prioritized the most and the largest margin from a standard is extracted.

step 3: If a plurality of evaluation values are the same in number for the shot regions each having the largest margin from the standard, shot regions each having the largest margin from the standard in the selected evaluation value are extracted in turn from a higher priority.

step 4: A provisional drop recipe used for the extracted shot regions at the time of imprinting is determined as the drop recipe.

Step 1 to step 4 can be performed in step S306.

FIG. 20 shows an example of a data table which is managed by the main controller 410 on a memory of the controller 400, and stores evaluation conditions and evaluation indices. Values in the Priority field and values in the Tolerance field can be input by using a screen in FIG. 19. Shot numbers each specifying a shot region when imprinting is performed by using only a full shot region can be indicated in a Shot field. Recipe names of provisional drop recipes to be used can be indicated in a Drop Recipe field. The provisional drop recipe used in each shot number is saved until a drop recipe is determined.

A waiting time from bringing the mold into contact with the imprint material to curing the imprint material is indicated in a Spread Time field. A pressure for deforming a pattern surface of the mold at the timing when a pattern surface P contacts the imprint material is indicated in a Cavity Pressure field. A pressure at the timing when the mold is brought into contact with the imprint material is indicated in an Imprint Force field. An exposure dose for curing the imprint material is indicated in an Exposure Dose field. The main controller 410 can obtain these pieces of information from a process recipe.

The following information in respective shot regions can be indicated in evaluation values of an Evaluation field.

Extrusion: the total sum of extruded areas

Void Defects: the number of defects for each of Ranks A, B, and C classified based on the sizes of the defects Alignment: position residues in die-by-die alignment for X and Y RLTU: variations in residual layer thickness in shot regions In this example, the main controller 410 can determine a drop recipe, for example, by the following procedure.

step 1: In all evaluated shot regions (shot numbers), shot regions 4 to 8, 12 to 14, 19, and 20 with all evaluation items satisfying a criterion are extracted.

step 2: In the extracted shot regions, Rank A in Void Defects of the evaluation index to be prioritized the most and Rank B of an evaluation index to be prioritized second are equal, and thus shot regions 5 and 6 each having a margin from a standard in an X value of the next evaluation index Alignment are extracted.

step 3: A plurality of evaluation values are the same in number for the shot regions each having the largest margin, and thus shot region 4 is extracted in the standard of Rank C having the third highest priority.

step 4: A provisional drop recipe used when extracted shot region 4 is imprinted is determined as the drop recipe.

According to a method of determining a drop recipe of the second embodiment, it becomes possible to efficiently determine a drop recipe used in a semiconductor manufacturing process in which evaluation indices influence each other.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-096541, filed May 15, 2017, and Japanese Patent Application No. 2018-089248, filed May 7, 2018, which are hereby incorporated by reference herein in their entirety.

What is claimed is:

1. A method of determining, by an imprint apparatus, information indicating an arrangement of an imprint material, the method comprising:
   repeating, by the imprint apparatus, a process of arranging an imprint material on a substrate in accordance with a provisional arrangement, forming a pattern of a cured imprint material by curing the imprint material on the substrate in a state in which a mold is brought into in contact with the imprint material on the substrate, and changing the provisional arrangement based on the pattern of the cured imprint material, until quality of the pattern of the cured imprint material on the substrate satisfies a predetermined condition; and
   determining, by the imprint apparatus, information indicating the arrangement of the imprint material based on the latest provisional arrangement at a stage where the quality of the pattern of the cured imprint material on the substrate satisfies the predetermined condition
   wherein the repeating of the process is performed by using the substrate on which the pattern of the cured imprint material has been formed, in a case where there is a free space on the substrate for arranging another imprint material thereon in accordance with the provisional arrangement changed in the changing, and
   wherein the predetermined condition includes a condition concerning extrusion of the imprint material from a pattern formed region.

2. The method according to claim 1, wherein a state in which a substrate holder of the imprint apparatus holds the substrate is maintained while the repeating is performed by using the substrate after the substrate holder holds the substrate.

3. The method according to claim 1, wherein the repeating is performed by using another substrate instead of the substrate in a case where there is no free space on the substrate for arranging the imprint material thereon in accordance with the provisional arrangement after the change to form the pattern of the cured imprint material.

4. The method according to claim 1, wherein the repeating is performed such that a first arrangement for a full shot region having a rectangular shape is determined by using the full shot region, then
   the repeating is performed such that a second arrangement for a partial shot region a part of which is defined by a substrate edge is determined by using the partial shot region, and
   the first provisional arrangement for determining the second arrangement is determined based on the first arrangement.

5. The method according to claim 1, wherein the repeating is performed such that a first arrangement for a full shot region having a rectangular shape is determined by using a full shot region of a substrate, then
   the repeating is performed such that a second arrangement for a partial shot region a part of which is defined by a substrate edge is determined by using a partial shot region of the substrate, and
   the first provisional arrangement for determining the second arrangement is determined based on the first arrangement.

6. The method according to claim 1, wherein the repeating is performed such that information indicating an arrangement of an imprint material for a partial shot region a part of which is defined by a substrate edge is determined, and
   a full shot region having a rectangular shape is used in one of whole and part of the repeating for determining the information indicating the arrangement of the imprint material for the partial shot region.

7. The method according to according to claim 1, further comprising obtaining, via a user interface, information for designating an examination region for examining whether the quality of the pattern of the cured imprint material satisfies the predetermined condition.

8. The method according to according to claim 1, further comprising determining, based on design information of the mold, an examination region for examining whether the quality of the pattern of the cured imprint material satisfies the predetermined condition.

9. A method of determining information indicating an arrangement of an imprint material in an imprint apparatus, the method comprising:
   repeating, by the imprint apparatus, a process of arranging an imprint material on a substrate in accordance with a provisional arrangement, forming a pattern of a cured imprint material by curing the imprint material on the substrate in a state in which a mold is in contact with the imprint material on the substrate, and changing the provisional arrangement for a plurality of shot regions of the substrate after a substrate holder of the imprint apparatus holds the substrate; and
   determining, by the imprint apparatus, information indicating the arrangement of the imprint material based on the provisional arrangement used to arrange the imprint material for a shot region where the pattern of the cured imprint material has been formed, which indicates an evaluation result satisfying a predetermined condition out of evaluation results of the patterns of the cured imprint material formed respectively on the plurality of shot regions, and
   wherein the predetermined condition includes a condition concerning extrusion of the imprint material from a shot region.

10. The method according to claim 9, wherein in the repeating, the pattern of the cured imprint material is formed on a designated imprint condition, and
    the imprint condition includes at least one of relative positions of the substrate and the mold when alignment between the substrate and the mold is completed, a time period from bringing the mold into contact with the imprint material to curing the mold, a pressure at timing when the mold is brought into contact with the imprint material, and deformation in the mold at timing when the mold is brought into contact with the imprint material.

11. The method according to claim 9, wherein the predetermined condition further includes a condition concerning at least one of unfilling of the imprint material, an alignment result, and a variation in residual layer thickness in a shot region.

* * * * *